United States Patent [19]
Rotman et al.

[11] Patent Number: 5,960,171
[45] Date of Patent: Sep. 28, 1999

[54] DYNAMIC SIGNAL LOOP RESOLUTION IN A COMPILED CYCLE BASED CIRCUIT SIMULATOR

[76] Inventors: Alan Rotman, 14 Shai Agnon Street #7, Ra'anana, Israel, 43380; Eshel Haritan, Pamoneet 57 Beit Arie, Doar Nah Ephraim, Israel, 71947; Michael L. Braddock, 6501 William Cannon Dr. West, Austin, Tex. 78735; Noam Erdman, Pashosh 14, Kfar-saba, Israel, 44246

[21] Appl. No.: 08/761,416

[22] Filed: Dec. 6, 1996

[51] Int. Cl.[6] ...................................... G06F 11/27
[52] U.S. Cl. .................. 395/185.02; 395/183.09; 395/183.21; 395/578
[58] Field of Search ................ 395/185.02, 183.06, 395/185.06, 183.01, 183.21, 183.09, 578

[56] References Cited

U.S. PATENT DOCUMENTS

| | | | |
|---|---|---|---|
| 4,314,329 | 2/1982 | Crewe et al. | 395/185.02 |
| 4,787,035 | 11/1988 | Bourne | 395/82 |
| 5,371,851 | 12/1994 | Pieper et al. | 395/164 |
| 5,535,331 | 7/1996 | Swoboda et al. | 395/183.21 |
| 5,537,580 | 7/1996 | Giomi et al. | 395/500 |
| 5,546,562 | 8/1996 | Patel | 395/500 |

OTHER PUBLICATIONS

Weber et al. Periodic Signal Suppression in a Concurrent Fault Simulator (IEEE, 5 pages) 1991.

*Primary Examiner*—Robert W. Beausoliel, Jr.
*Assistant Examiner*—Pierre Eddy Elisea
*Attorney, Agent, or Firm*—Bruce E. Hayden; Jeffrey G. Toler

[57] ABSTRACT

A compiled cycle based circuit simulator efficiently implements dynamic loop resolution at execution time. A static loop arises when a plurality of signals appear to be interdependent. In a properly designed circuit, apparent looping of signals is usually protected by other mutually exclusive signals. A dynamic loop exists when the signals are actually interdependent. A cyclic clock is divided into a fixed plurality of time slots. During each time slot that a plurality of interrelated signals can change, code for the interdependent signals used by other logic or memory elements are demand generated as function calls. Within each such called function, computation of dependent interdependent signals is by function call protected by control signals. Nondynamic static looping of signals is thus efficiently ignored. Dynamic looping is detected and reported through monitoring of function call depth.

19 Claims, 21 Drawing Sheets

COMBINATIONAL LOGIC
```
a = (b & c);
b = ~d;
c = e | f | g;
g = h & i;
j = k | l | m | n;
x = y & z;
```

PROCEDURE LOGIC
```
always @ (posedge clk)
    if (enb)
        ff1 = a;
```

→

'C' CODE
```
g = h & i;

c = e | f | g;

b = ~d;

a = (b & c)

if (enb)

ff1 = a;
```

PROGRAM EXECUTION

TIME

```
main ()
{
    sim_time = 0
    for (;;)
    {
        g = h & i;
        c = e | f | g;
        b = ~d;
        if (enb)
            ff1 = a;
        sim_time = sim_time + 20;
    }
}
```

DYNAMIC SIGNAL LOOP RESOLUTION IN A COMPILED CYCLE BASED CIRCUIT SIMULATOR

CROSS REFERENCE TO RELATED APPLICATION

This application is related to our commonly assigned copending United States patent applications entitled: "COMPILED CYCLE BASED SIMULATOR UTILIZING LOGIC LEVELIZATION AND REDUCTION OF REDUNDANT COMBINATIONAL LOGIC COMPUTATIONS" by Alan Rotman et. al., having docket number SC0500EI and filed of even date herewith;

"COMPILED CYCLE BASED CIRCUIT SIMULATOR OPTIMIZED USING STATE ARITHMETIC" by Alan Rotman et. al., having docket number SC0502EI and filed of even date herewith.

FIELD OF THE INVENTION

The present invention generally relates to integrated circuit simulation, and more specifically to optimizing a compiled cycle-based integrated circuit simulator.

BACKGROUND OF THE INVENTION

Dynamic verification via simulation of Very Large Scale Integration (VLSI) chips is one of the most time-consuming steps of VLSI design. Increasing the speed at which simulation is performed can greatly reduce the cycle-time for designing VLSI chips. It also allows for more extensive testing, resulting in more reliable chips. Reducing the memory consumption required during these simulations makes it is possible to run simulations on all low-end computers, and to run multiple simulations on the same computer. This allows designers to exploit all plant wide computing resources. Running multiple simulations in parallel allows more simulation cycles to be run per unit time.

The Verilog Hardware Description Language (Verilog) is a hardware description language in common use for specifying Integrated Circuit (IC) designs for use in testing such IC designs through simulation testing. Verilog describes a hardware design or part of a design. Descriptions of designs in Verilog are Verilog Models. Verilog is both a behavioral and a structural language. Verilog Models can describe both the functionality of a design and the components and connections to the components in a design.

Verilog-XL from Cadence Design Systems is commonly used to interpret Verilog code. Unfortunately, Verilog-XL is quite slow interpreting Verilog. The result of this slowness has been that IC designers have not been able to do as much testing as might seem desirable.

DETAILED DESCRIPTION OF A PREFERRED EMBODIMENT

Verilog code can be interpreted or compiled. As expected, compiled code executes significantly faster than interpreted code, but compilation incurs a compilation overhead. In response to the problems outlined above, an optimizing Verilog compiling program, "VCX", was developed. It operates on a large subset of Verilog called the Motorola Register Transfer Language (MRTL) and generates compiled models that execute between twenty-five (25) and two hundred (200) times as fast as Verilog-XL interpreting the same Verilog model.

Figure 1:
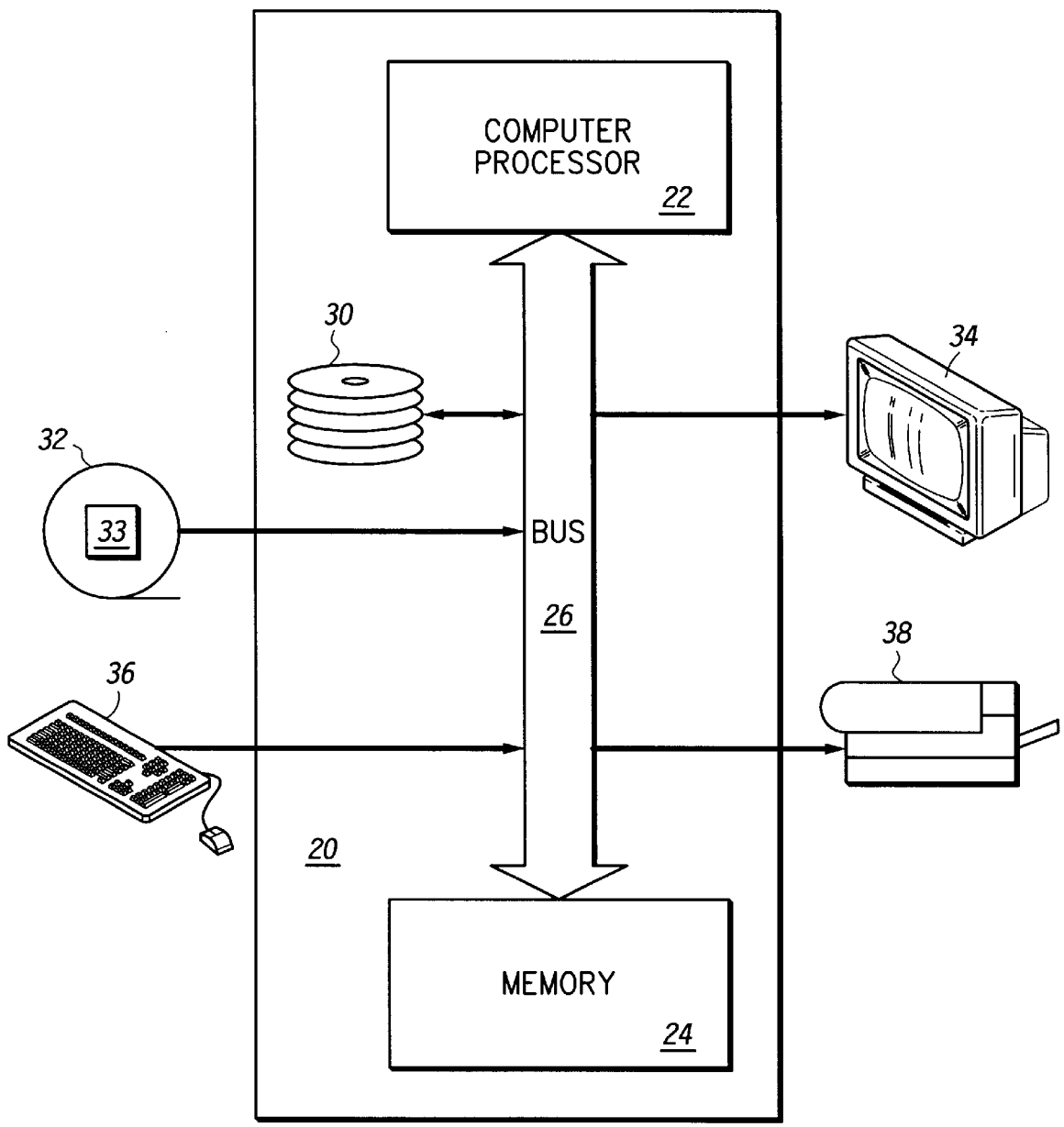
FIG. 1 is a block diagram that illustrates a General Purpose Computer in accordance with the present invention.

FIG. 1 is a block diagram showing a General Purpose Computer 20. The General Purpose Computer 20 has a Computer Processor 22, and Memory 24, connected by a Bus 26. Also connected to the Bus are Secondary Storage, such as hard disk drives 30, External Storage 32, a monitor 34, a keyboard (with mouse) 36, and a printer 38. The External Storage 32 may be floppy disks, magnetic tape, CD-ROM, or even another computer connection via a communications line. Note that executable versions of computer software 33, such as the VCX program and user models can be read from the External Storage 32 and loaded for execution directly into the Memory 34, or stored on the Secondary Storage 30 prior to loading into Memory 34 and execution.

Figure 2:
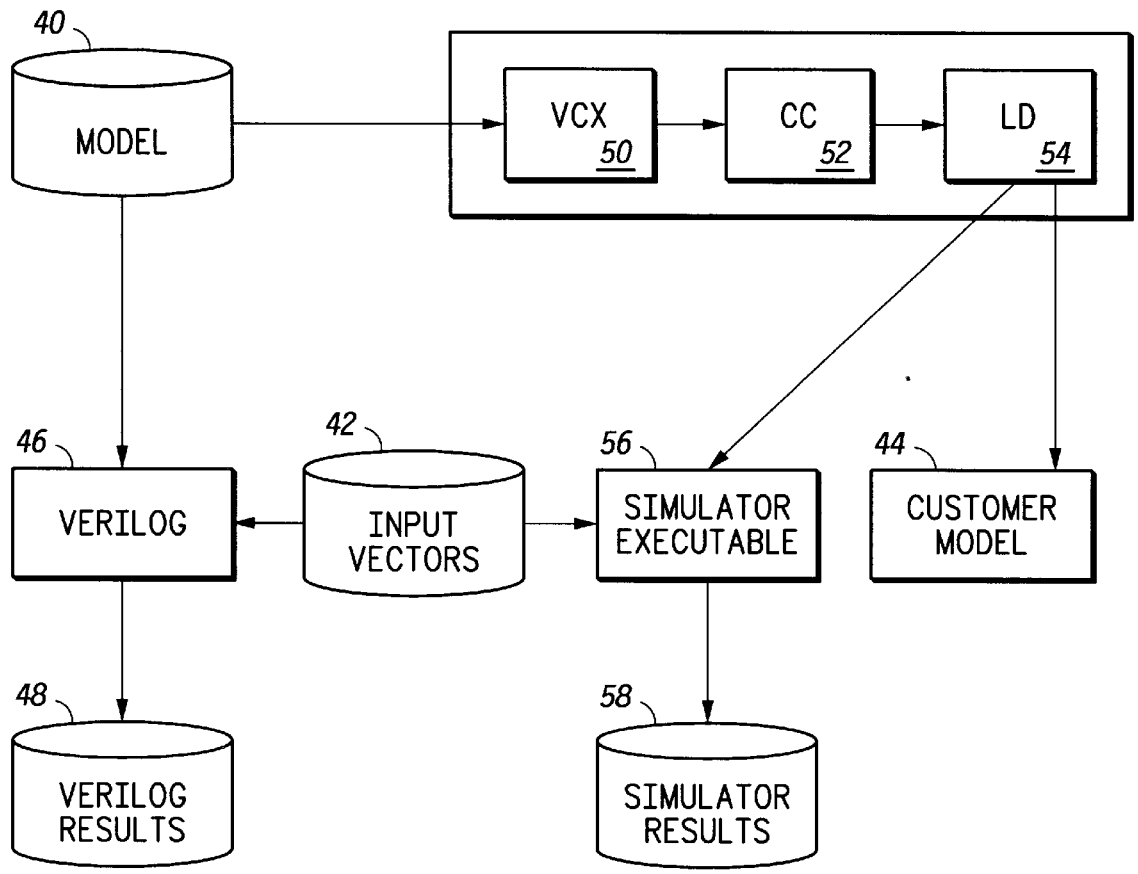
FIG. 2 is a data flow block diagram that illustrates the components in the VCX system in accordance with the present invention.

FIG. 2 is a data flow block diagram showing the components in the VCX system. An Integrated Circuit (IC) model 40, usually stored on Secondary Storage 30, is written in MRTL, a subset of Verilog. It can be interpreted by a Verilog-XL program 46, generating Verilog results 48, either stored on Secondary Storage 30, or printed on printer 38. The input to the Model 40 are the Input Test Vectors 42, usually also stored on Secondary Storage 30.

Instead of interpreting the model, as is done by the Verilog-XL program 46, the VCX system uses the VCX program 50 to generate compilable source code. The compilable source code, in this case "C", is then compiled 52 and linked 54 into a Simulator Executable 56 computer program, stored on either Secondary Storage 30, or External Storage 32. The Simulator Executable 56 uses the Input Test Vectors 42 as input, generating Simulator Results 58, either stored on Secondary Storage 30, or printed on printer 38. If the designer followed the MRTL guidelines, the Simulator Results 58 will be equivalent to the Verilog Results 48, indicating that the Simulator Executable 56 operates equivalently to the Verilog-XL program 46 interpreting Model 40.

In addition to generating a Simulator Executable 56, the Model 40 can also be used by VCX 50 to generate a Customer Model 44 computer program. This allows a company designing an IC to get a working model to their customers of the IC long before first silicon is available. This has the benefit of reducing time to market for the customer. The compiled nature of these customer models also impedes attempts at reverse engineering the design. The Customer Model 44 may be created on either Secondary Storage 30 or External Storage 32, but is usually shipped to the customer on External Storage 32 media.

Figure 3:
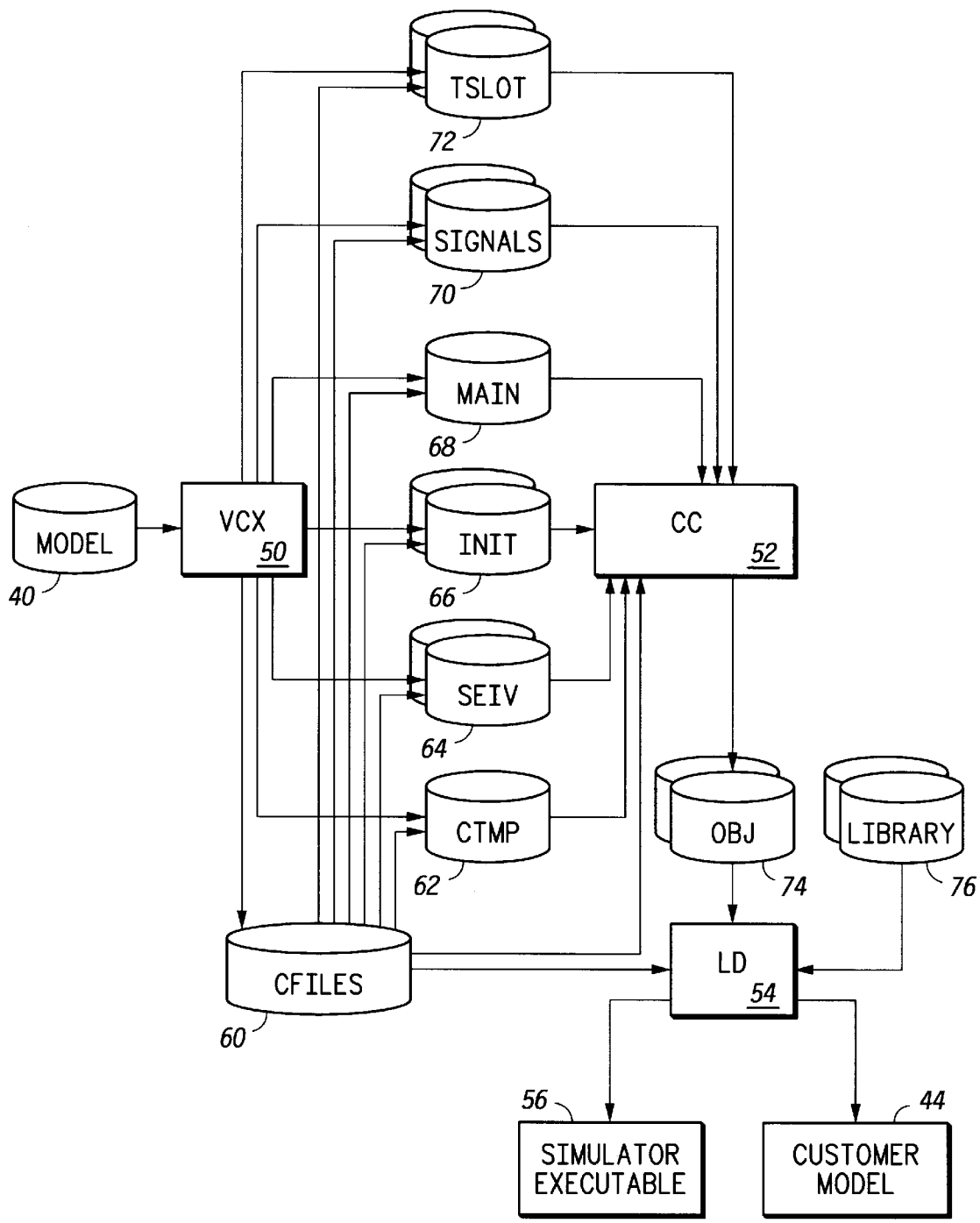
FIG. 3 is a data flow block diagram that illustrates in more detail the files used and generated in the VCX system illustrated in FIG. 2.

FIG. 3 is a data flow block diagram showing in more detail the files used and generated in the VCX system. As noted above, the IC model 40 is input to the VCX program 50. The model is written in MRTL, a subset of Verilog. Additional parameters can be input via the VCX program 50 processor call interface.

The VCX program 50 generates six types or sets of files, all usually stored on Secondary Storage 30. The CFILES file 60 contains a list of C language files to be compiled. This allows accurate compilation even if the directory receiving C source language files contains additional files. One or more CTMP or Concatenation C language files 62 are generated. SEIV or Random Initialization files 64 contain headers (.h) and source code (.c) to optionally randomly initialize memory elements in the Model 40. These files are generated with the -init VCX option. This initialization routine allow all registers to be initialized to either 0, 1, or a random number based on a seed value. Note that if the "init" routines are not generated, then all registers are initialized to zero (0), except for dynamic C memory which is usually uniniatialized. Init or User Initialization files 66 contain headers (.h) and source code (.c) for user initialization of the memory elements.

Source code for the main program loop is stored in the Main File 68. It calls the rest of the C language routines as needed, as well as any library routines. The standard C driver program calls the initialization routines in the initialization files 64, 66 first. The driver then enters an infinite loop, looping through each of the time slots, invoking one or more routines for each time slot that requires evaluation. Time slot routines are stored in time slot (TSLOT) files 72. One or more source code files are typically generated for each active time slot. The maximum size of the initialization files 64, 66, and time slot files 72 can be specified with the VCX -t option. Finally, there are Signals files 70, which include signal declarations. The maximum size of the signal file(s) 70 can be specified with the VCX -d option.

The six sets or types of files 60, 62, 64, 66, 68, 72 are used as input to a C compiler 52. Using these files as input, the C compiler 52 generates object files 74. The object files 74 are combined with library routines 76 by a link editor (LD) 54 to generate either the Simulator Executable 56 and/or Customer Model 44 computer programs. The Link Editor 54 can also be used to combine multiple models into a single executable. This can be done by utilizing a main program 68 that invokes all of the multiple models.

Figure 4:
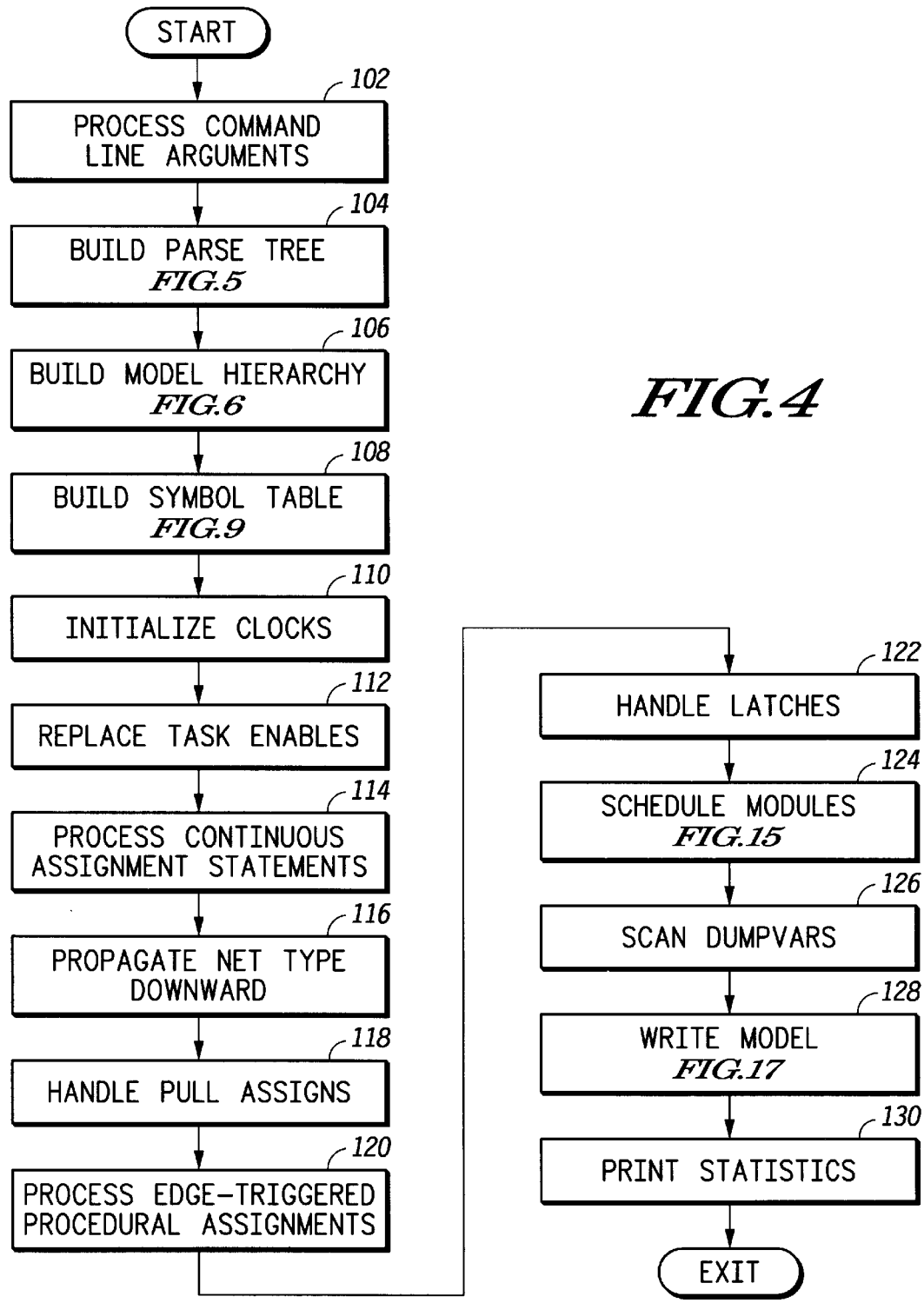
FIG. 4 is a flow chart that illustrates the normal operation of the VCX program illustrated in FIG. 3.

FIG. 4 is a flow chart that shows the normal operation of the VCX program 50. First the command line arguments are processed, step 102. This utilizes the standard C language argv/argc constructs. This includes identification of input and output files and sets global VCX compiling options. Next, the parse tree is built, step 104 (see FIG. 5). Next, the model hierarchy is built, step 106 (see FIG. 6). This instantiates all module instances. The symbol table is then built, step 108 (see FIG. 6). Clocks are initialized, step 110. This requires that all global clocks have the same number of time slots. The waveform expressions of all of the global clocks are also initialized. To process Task Enables, step 112, the Model Hierarchy 219 is traversed, and every task enable is replaced with a copy of the task itself.

Continuous assignments are processed in step 114. This is done by traversing the Model Hierarchy 219, adding every CASSIGN item to the global CASSIGN list. Each identifier on the Left Hand Side (LHS) of a continuous assignment statement is found in the symbol table and a CAITEM item referencing the corresponding CASSIGN item is added to the Model Hierarchy 219.

Following the continuous assignment processing in step 114, the net types that are TRI and WIRE elements are propagated from the physical level to all lower levels, step 116. Next, PULL ASSIGNS are processed, step 118. The CASSIGN list is searched for (PULL1, PULL0) assignments that do not have non-pull assignments to the same identifier. In all such CASSIGN items found, the pull assignment is converted to a (STRONG0, STRONG1) assignment. Next, all procedural assigns are processed in step 120. The model hierarchy is traversed to add every edge triggered procedural statement to the PASSIGN list.

Next, the latches are handled in step 122. This requires that the CASSIGN list is traversed to identify CASSIGN latches, "always" block latches, dynamic wires, and muxes, and the associated timing for each of the above. After the latches are processed in step 122, the Schedule Module routine is involved, step 124 (see FIG. 15). This is followed by invoking the Scan Dumpars module, step 126 in which the Model Hierarchy 219 is traversed looking for the system task $dumpvars. The dump information from each such $dumpvars is entered into the Symbol Table 231. The C code description of the Verilog Model is then written to Secondary Storage 30 files, step 128 (see FIG. 17), and VCX translation statistics are printed, step 130 before exiting the VCX program 50.

Figure 5:
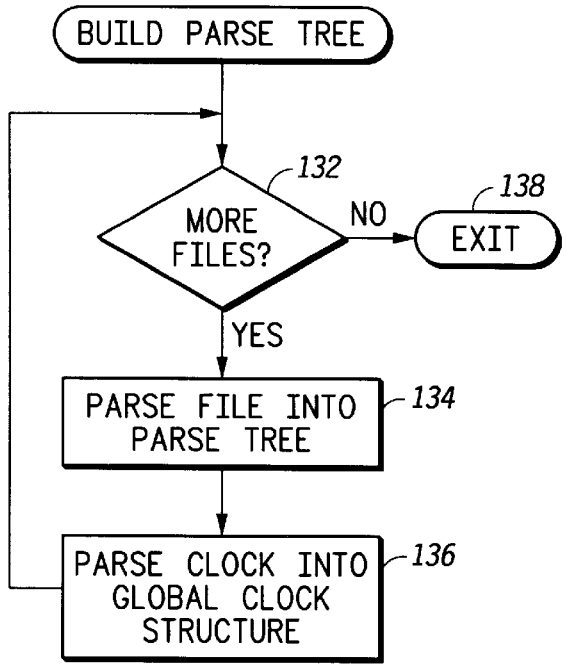
FIG. 5 is a flow chart that illustrates how a Parse Tree is built in FIG. 4.

FIG. 5 is a flow chart showing how a Parse Tree is built in step 104 in FIG. 4. Model files 40 specified on the VCX 50 processor call line are processed one at a time. While there are more model files 40 to process, step 132, another Model file 40 is parsed into the Parse Tree, step 134. Clock information in the Model file 40 is parsed into a global clock structure, step 136. When there are no more Model files 40 to process, step 132, the Parse Tree module exits, step 138.

Figure 6:
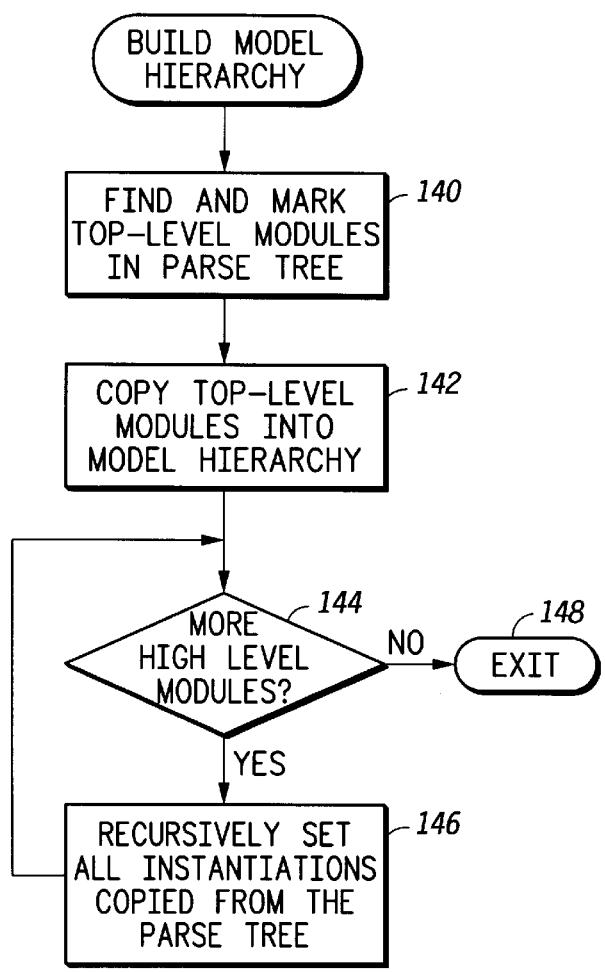
FIG. 6 is a flow chart that illustrates how a Model Hierarchy is built in FIG. 4.

FIG. 6 is a flow chart showing how a Model Hierarchy 219 is built in step 106 in FIG. 4. The Parse Tree built in FIG. 5 is scanned in order to find all modules. All top level modules are marked as such, step 140. The top level modules are then copied into a Model Hierarchy 219, step 142 (see FIG. 8). Then starting with each high level module, step 144, instantiation statements are set to point to the correct description, which is copied from the Parse Tree, step 146. When there are no more top level modules to process, step 144, the Build Module Hierarchy module exits, step 148. Note from this description the VCX program 50 support for multiple high level modules.

Figure 7:
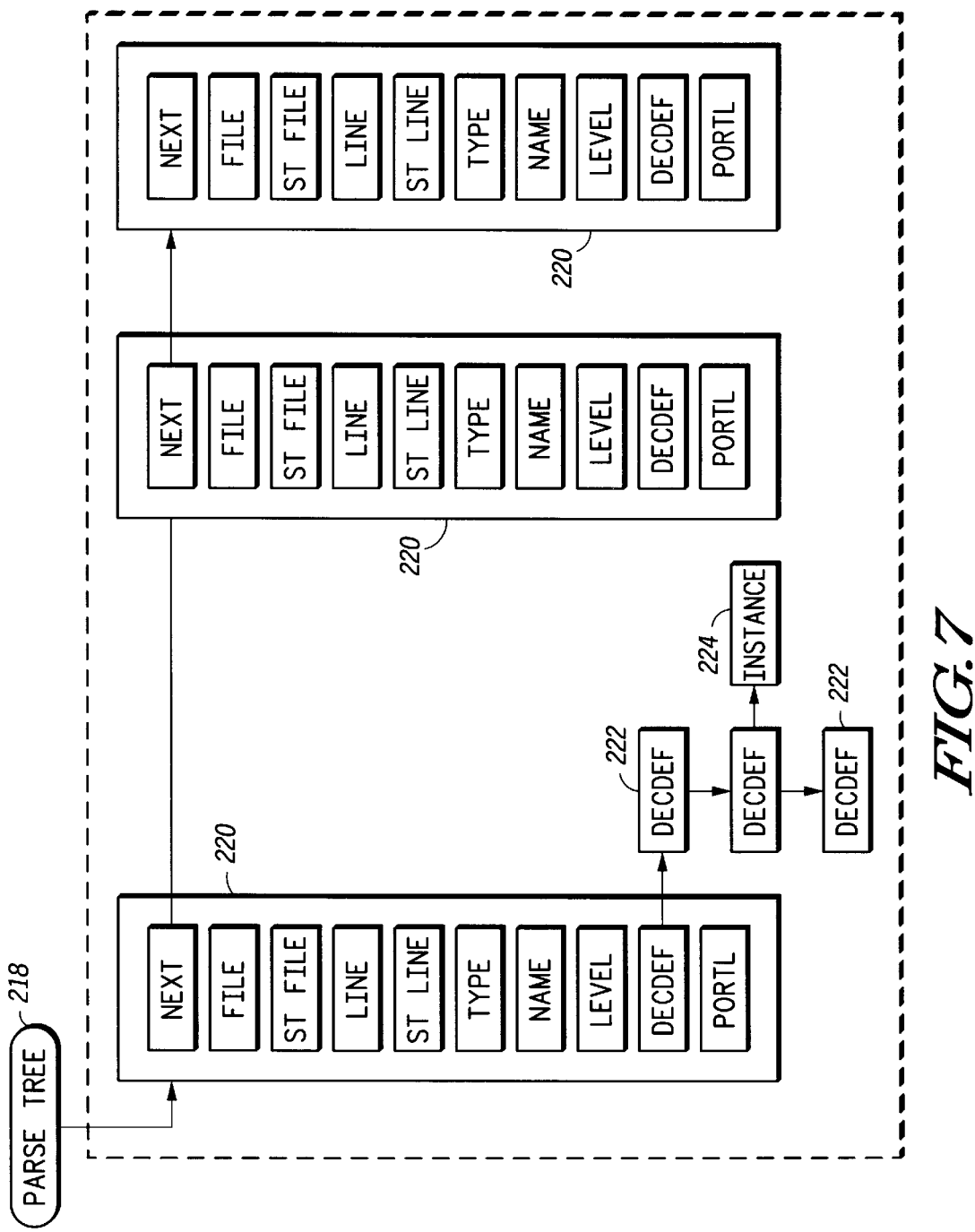
FIG. 7 is a data structure diagram that illustrates the items in the Parse Tree utilized by the flow chart in FIG. 5.

FIG. 7 is a data structure diagram showing the items in the Parse Tree. One Module Definition item 220 is created for each module described in the Model files 40. The head pointer 218 points at a forward linked list of Module Definition items 220. The DECDEF field in each of the Module Definition items 220 is used to point at a forward linked list of DECDEF items 222. These DECDEF items 222 contain the Declarations (DEC) and Definitions (DEF) included in the defined module. The declarations in the DECDEF items 222 can be module "INSTANCE" declarations.

Figure 8:
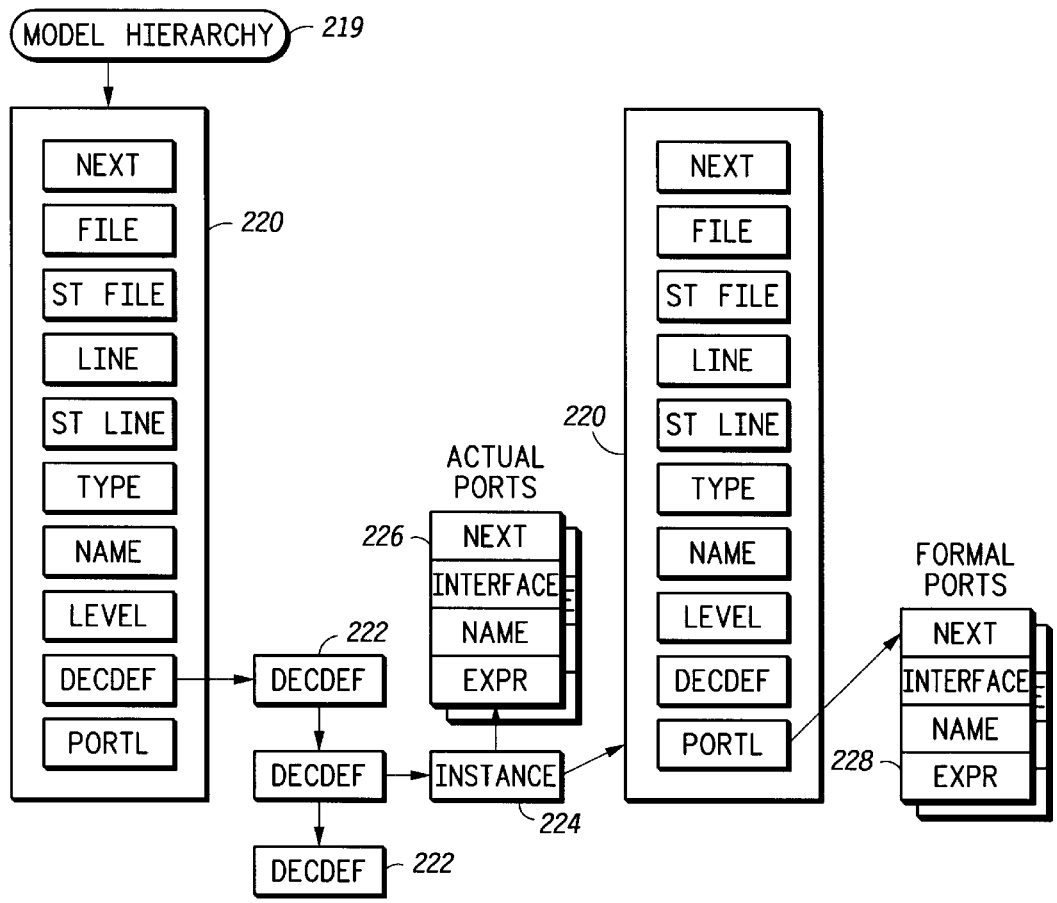
FIG. 8 is a data structure diagram that illustrates flattening of the Module Hierarchy by instantiating modules.

FIG. 8 is a data structure diagram showing flattening of the Module Hierarchy 219 by instantiating modules. Each INSTANCE list item 224 is linked to a copy of the corresponding DECDEF item 222. The INSTANCE list item 224 includes an item that points at the Module Definition item 220 that is the subject of the INSTANCE declaration. For each instantiation of each module, a separate Module Definition item 220 with associated DECDEF 222 list is included in the Model Hierarchy 219.

Verilog supports "ports". Ports provide a means of interconnecting a hardware description consisting of modules, primitives, and macro definitions. For example, module A can instantiate module B, using port connections appropriate to module A. Connections between elements in module A and module B can be made even though the port names can differ from the names of the internal nets and registers specified in the definition of module B.

Two methods of making connections between ports listed in a module instantiation (Formal Ports) and the ports defined by the instantiated module (Actual Ports) exist. The first is by ordered list. In this method, Formal Ports are listed in the same order as the corresponding Actual Ports. The second method for connecting module ports is by name. It consists of explicitly linking the two names for each side of the connection—the name used in the module definition (Formal Port) followed by the name used in the instantiating module (Actual Port).

A module port can be viewed as providing a link or connection between two items, such as nets, registers, wires, etc.—one internal (Formal Port) to the module instance, and one external (Actual Port) to the module instance. Whenever possible, port connections are collapsed during processing. This means that two ports become one entity. Both names continue to exist as separate symbols, but both symbols address the same element.

Ports are very similar in concept to formal and actual parameters found in most procedural computer languages. VCX 50 expands modules inline where invoked, instead of invoking them remotely at run time. Thus, modules are treated more like C language #define's than function calls. The result is that the Actual Port/Formal Port connection is primarily done in VCX 50 at compile time and consists essentially of text substitution.

In FIG. 8, the INSTANCE list item 224 has a pointer to Actual Port items 226. There is one Actual Port item 226 for each actual port in the INSTANCEd module invocation. The Actual Port items 226 for a given INSTANCE 224 are forward linked into a list headed by the INSTANCE item 224. The module definition item 220 for the invoked module contains a link to a similar forward linked Formal Port item 228 list corresponding to the module's Formal Ports. The Formal Port items 228 each contain a link to a string symbolically identifying the Formal Port (e.g. the WIRE name). Normally, there is a one to one correspondence between the Actual Port items 226 and Formal Port items 228. In other words, the first Actual Port item 226 corresponds to the first Formal Port item 228. However, the VCX program 50 (and Verilog) allows a user to specify by name which formal ports correspond with which actual ports.

Figures 9, 15:
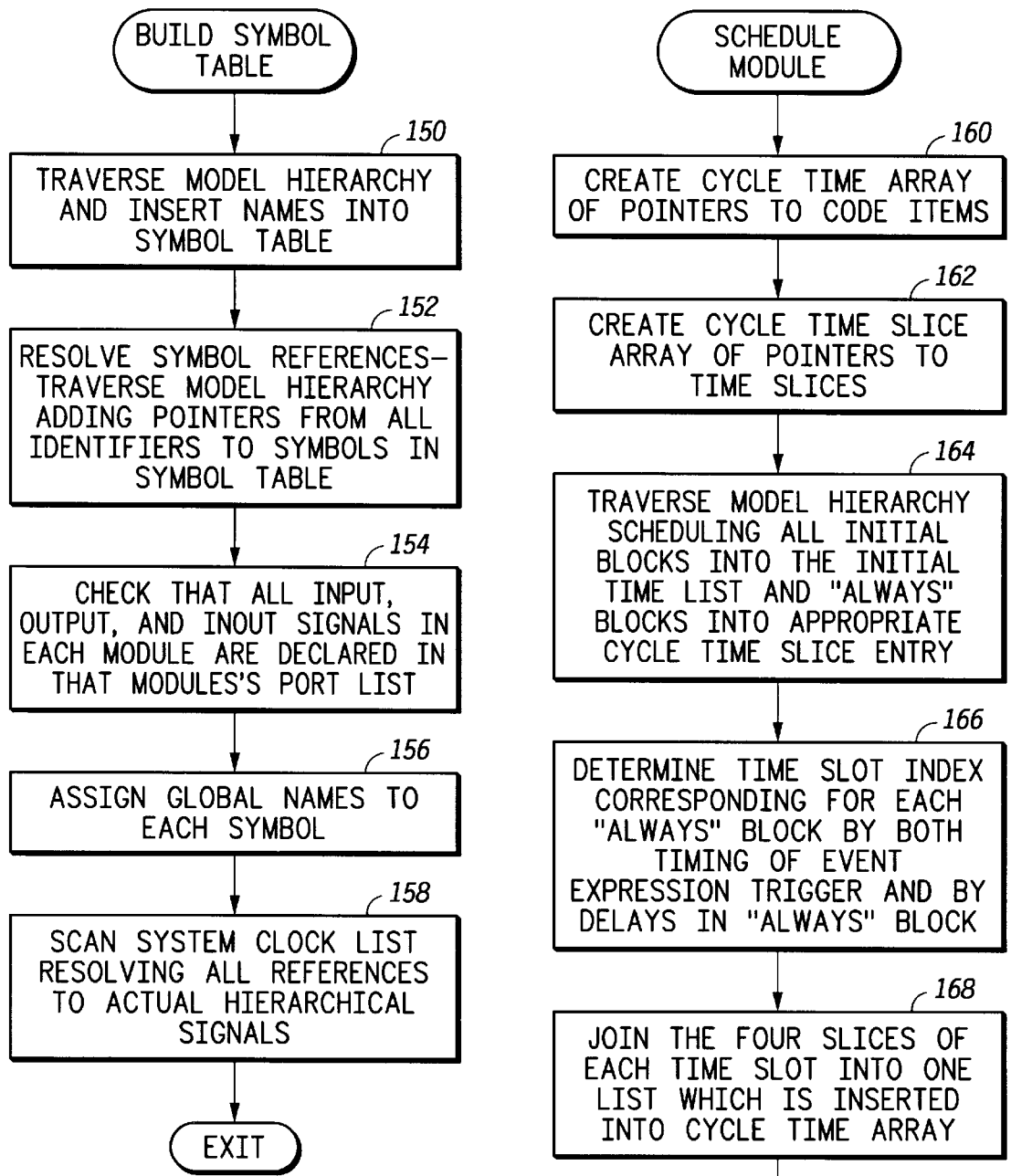
FIG. 9 is a flow chart that illustrates how the Symbol Table is built in FIG. 4.
FIG. 15 is a flow chart that illustrates Module Scheduling in FIG. 4.

FIG. 9 is a flow chart showing how the Symbol Table 231 is built in step 108 in FIG. 4. The Model Hierarchy 219 is traversed. The name of each module, identifier, task, instance, begin_block, and variable is inserted into the Symbol Table 231, step 150. Next, symbol references are resolved by traversing the Model Hierarchy 219. Pointers from all identifiers to the symbols in the Symbol Table 231 are added, step 152. At the same time, a check is made that all input, output, and inout signals in each module are declared in the module's port list, step 154.

Global names are then assigned to each symbol, step 156. This is a two step process. First, the Model Hierarchy 219 is recursively traversed for each module. A Link_Instantiation routine is invoked to connect actual ports to formal ports. Secondly, the Assign_Alias routine is invoked to recursively traverse the entire Symbol Table 231, calling Assign_Port_Names and Assign_Local_Names to assign aliases to each name. Each name is appended with a scope count to guarantee uniqueness. Some symbols are assigned to local "C" variable names, while others are collapsed so that they refer to the same "C" variables as other symbols. Finally, the system clock list is scanned to resolve all references to actual hierarchical signals, step 158.

Figure 10:
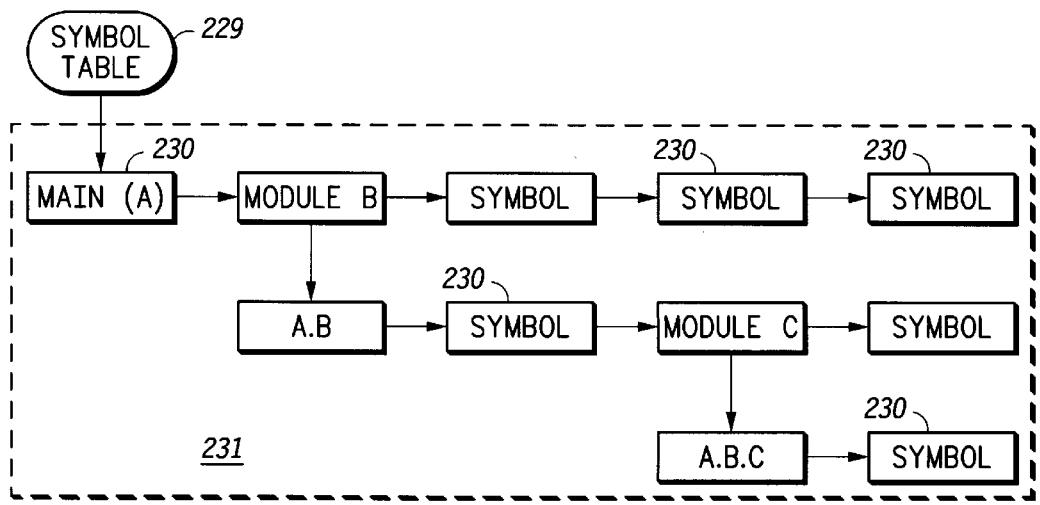
FIG. 10 is a data structure diagram that illustrates the items in the Symbol Table.

FIG. 10 is a data structure diagram showing the items in the Symbol Table. The Symbol Table 231 consists of a forward linked list of Symbol Table Items 230. The start of the Symbol Table 231 is a Symbol Table head 229 which points at the first Symbol Table Item 230. The Symbol Table items 230 contain fields for the forward (next) link, a physical pointer, a pointer to a parent item, a pointer to the alias assigned in step 156, a link to a list of Continuous Assignment Items (CAITEMs) 236 (see FIG. 14), a link to a Formal Port list 228, and a link to the next lower level. For example, in FIG. 10, there is a link from Module B to A.B, and from Module C to A.B.C. The "physical" pointer points to the highest symbol that this symbol was collapsed into, if it was collapsed. Otherwise, it points to itself. Note that some of the link fields may be used for different purposes depending on the type of symbol being described.

Figure 11:
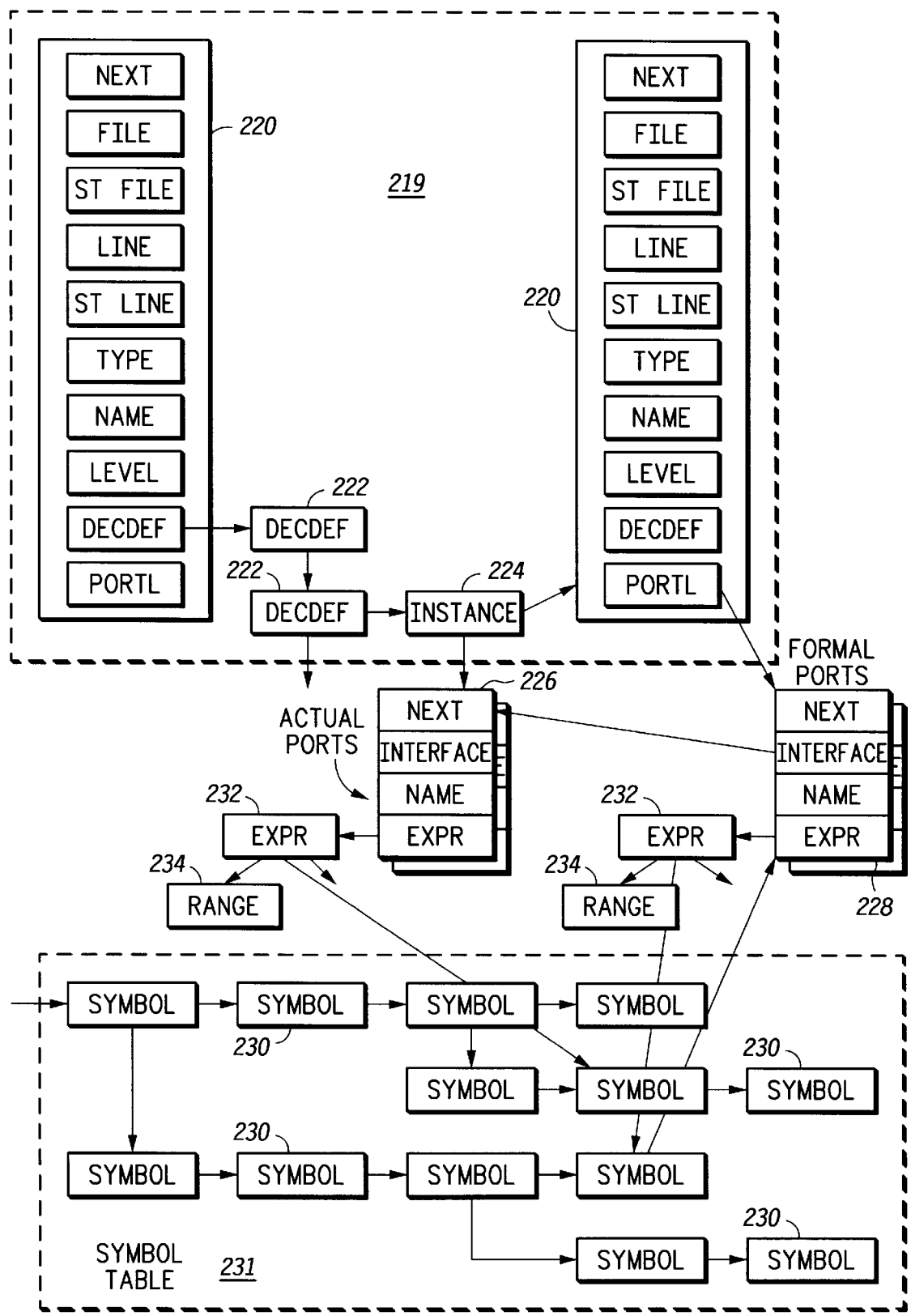
FIG. 11 is a data structure diagram that illustrates resolution of formal ports utilizing the symbol table illustrated in FIG. 8 and the flattened hierarchy illustrated in FIG. 8.

FIG. 11 is a data structure diagram showing resolution of formal ports utilizing the symbol table shown in FIG. 10 and the flattened hierarchy shown in FIG. 8. Module Definition items 220 in the Model Hierarchy 219 have been created for each instance of each module. The DECDEF pointer item in the Module Definition items 220 point to DECDEF items. DECDEF items 220 referencing "Instance" statements point to INSTANCE items 224. These INSTANCE items 224 point at both an ACTUAL PORT list 226, and the Module Definition item 220 corresponding to the module referenced by the Instance statement. The ACTUAL PORT list 226 is a forward linked list of ACTUAL PORT items 226, with one ACTUAL PORT item 226 per Actual Port in the Module Instance.

The Module Definition item 220 referenced by the INSTANCE item 224 has a PORTL field that points to a forward linked list of FORMAL PORT items 228. The ACTUAL PORT item 226 list and the FORMAL PORT item 228 list are linked lists of port items. Under normal circumstances the correspondence between actual ports and formal ports is on a location basis, i.e. the first actual port corresponds to the first formal port, while the second actual port corresponds to the second formal port, etc. As there is one ACTUAL PORT item 226 per actual port coded, and one FORMAL PORT item 228 created per potential formal port, in such locational referencing, the first ACTUAL PORT item 226 is matched with the first FORMAL PORT item 228, while the second ACTUAL PORT item 226 is matched with the second FORMAL PORT item 228, etc. Note though that both Verilog-XL and VCX 50 support named correspondence, where the ACTUAL PORT items 226 are matched with FORMAL PORT items 228 by name and not by location.

Each FORMAL PORT item 228 has an INTERFACE field which is a link to the corresponding ACTUAL PORT item 226, if coded. Note that neither Verilog-XL nor VCX 50 require that all Formal Ports have corresponding Actual Ports configured for each module invocation. This situation is indicated by a null pointer in the INTERFACE field in the FORMAL PORT item 228. This linking allows for symbolic parameter substitution.

Both the ACTUAL PORT items 226 and FORMAL PORT items 228 contain EXPR fields which contain links to Expression (EXPR) items 232. These are used to describe expressions coded in the Actual Ports and Formal Ports. In the case of the EXPR item describing an identifier, the EXPR items 232 contain links to pair of RANGE items 234 and to a SYMBOL item 230. In other cases, EXPR items may represent a numeric or string constant, a function call, or an operator. In this latter case, the EXPR item points to one or more sub-expressions. Note that SYMBOL items 230 describing Formal Ports also link back to the corresponding FORMAL PORT items 228.

Figure 12:
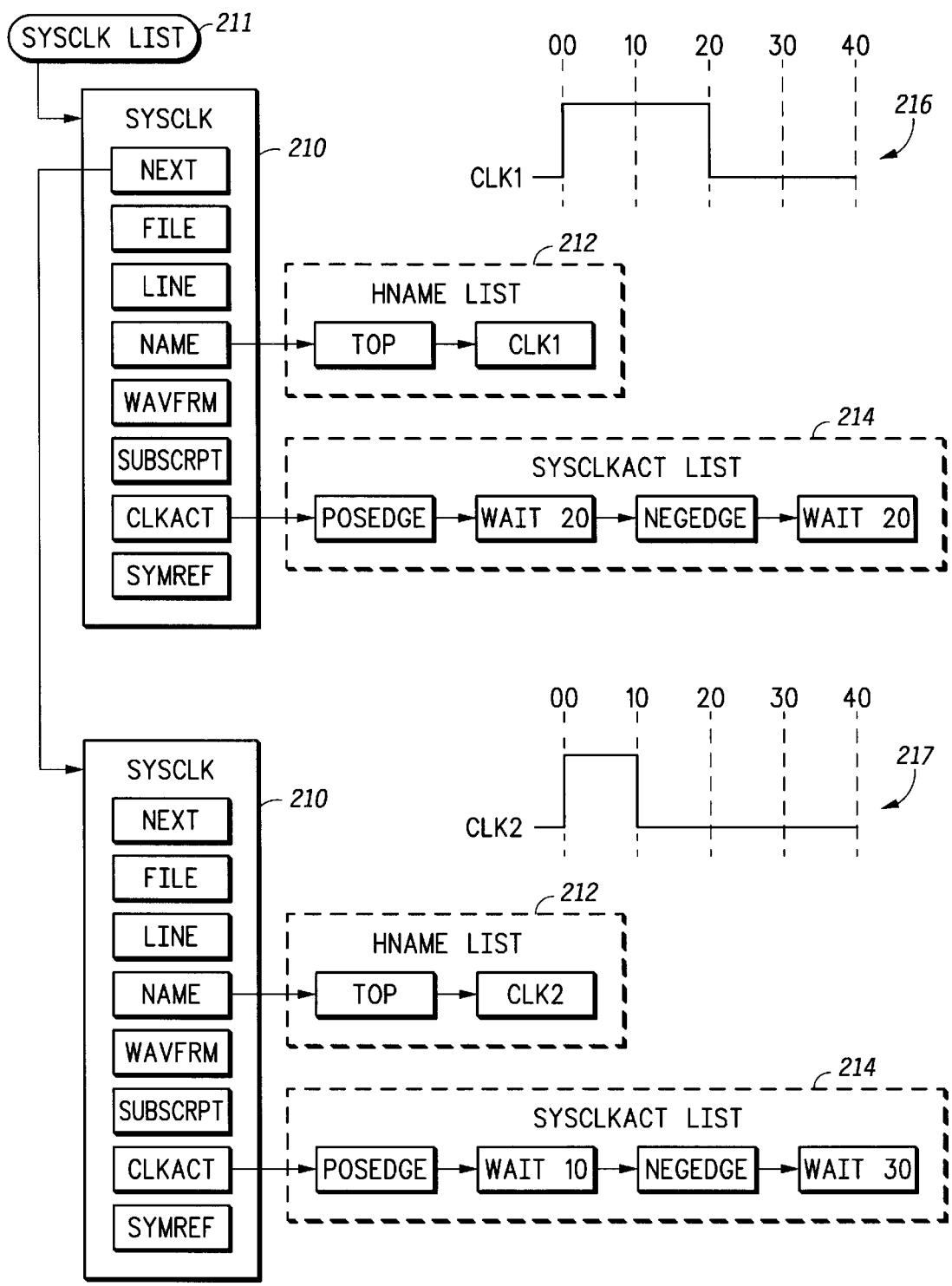
FIG. 12 is a data structure diagram that illustrates clock initialization from FIG. 4.

FIG. 12 is a data structure diagram showing clock initialization from step 110 in FIG. 4. The clock initialization information is provided to VCX in the form of a C language/Verilog comment. It is interpreted as a comment by other Verilog simulators such as Verilog-XL. A System Clock (SYCLK) List 211 is formed by liking System Clock (SYSCLK) items 210. Each item 210 in the SYSCLK list 211 represents a single clock. In the present embodiment, system clock specifics are specified in special VCX statements of the following form:

/*!vcx time
  begin
    top.clk1:posedge, wait 20, negedge, wait 20;
    top.clk2:posedge, wait 10, negedge, wait 30;
  end
*/

The first clock (top.clk1) corresponds to the first clock listed in FIG. 12, and the second clock (top.clk2) corresponds to the second clock listed. Note the associated timing diagrams for top.clk1 216 and top.clk2 217. Relevant items in the SYSCLK are listed in Table T-1.

TABLE T-1

System Clock (SYSCLK) List Items

| FIELD | Description |
|---|---|
| NEXT | Link to next SYSCLK item in chain. |
| FILE | Pointer to file containing clock |
| LINE | Starting line number of line describing clock |
| NAME | Link to the name of the clock |
| WAVFRM | Link to string containing a waveform describing the clock. |
| SUBSCRIPT | Optional Bit specification |
| CLKACT | Link to SYSCLKACT chain (see below). |
| SYMREF | Link to symbol list reference for clock. |

For each SYSCLK item 210, its NAME field is a pointer to a Hierarchical Name (HNAME) list 212. This consists of a forward linked list of HNAME items, one for each name in the hierarchy. In the item for first clock shown, the two levels are "top" and "clk1". There is also a System Clock Action (SYSCLKACT) List 214 consisting of a forward linked list of SYSCLKACT items. These SYSCLKACT items describe the actions of the associated clock. For example, the first clock in the SYSCLK list 211 is defined as:

top.clk1:posedge, wait 20, negedge, wait 20;

This results in the four SYSCLKACT items of:
POSEDGE
WAIT 20
NEGEDGE
WAIT 20

As noted above, this corresponds to timing diagram 216. The Waveform (WAVFRM) field is a pointer to a string containing a representation of the clock. It will contain one byte for each time unit. In the two cases shown, the total clock cycles are both forty units long, and thus the waveform for each of the two clocks will be forty bytes long. Earlier implementations of VCX utilized either "0" or "L" for a low state, and "1" or "H" for a logical high state. The current embodiment utilizes the following convention:

TABLE T-2

Waveform Convention

| Chr | Name | Description |
|---|---|---|
| P | Posedge | Positive Edge |
| N | Negedge | Negative Edge |
| 0 | Zero | Logical Low State |
| 1 | One | Logical High State |

This results in the following Waveforms for the two clocks shown:

TABLE T-3

Clock Waveforms

| Clock | 00000000011111111112222222222333333333334<br>12345678901234567890123456789012345678 90 |
|---|---|
| CLK1 | P111111111111111111N000000000000000000 00 |
| CLK2 | P111111111N00000000000000000000000000 00 |

The VCX program 50 supports acyclic events, such as gated clocks. In mapping acyclic behavior of a gated clock into a cycle-based simulator, a more complex waveform specification is defined in Table T-4:

TABLE T-4

Waveform Convention (Full)

| Chr | Name | Description |
|---|---|---|
| P | Posedge | Positive Edge |
| N | Negedge | Negative Edge |
| p | NotNegedge | Possible Positive Edge |
| n | NotPosedge | Possible Negative Edge |
| E | Edge | Possible Edge |
| — | Unknown | Unknown/stable |
| 0 | Zero | Logical Low State |
| 1 | One | Logical High State |

Table T-5 contains the Waveform State Transitions using the acyclic states and transitions shown in Table T-4. Positive (P) and Negative (N) edges have their usual effect, either transitioning to a logical one (1) or 10 logical zero (0) as appropriate. The other edges (p, n, E) result in an unknown (–) status until the next edge is encountered.

TABLE T-5

Waveform State Transitions

| Old State | Edge Encountered | | | | |
|---|---|---|---|---|---|
| | P | N | p | n | E |
| P | 1 | 0 | — | — | — |
| N | 1 | 0 | — | — | — |
| p | 1 | 0 | — | — | — |
| n | 1 | 0 | — | — | — |
| E | 1 | 0 | — | — | — |
| — | 1 | 0 | — | — | — |
| 1 | 1 | 0 | — | — | — |
| 0 | 1 | 0 | — | — | — |

The acyclic arithmetic is defined as follows. All possible outputs for the two unary actions (NOT, DEFAULT) and the six (6) binary actions (AND, EQ, NEQ, OR, RESOLVE, DEFAULT) are specified, given that the input and output can be one of the eight (8) states listed in Table T-4. In order to calculate the outputs of all eight (8) states, one first specifies all possible outputs from the five (5) primitives (NOT, AND, EQ, NEQ, OR), given that the input and output can be one of the four (4) states (P, N, 1, 0). As used here, the terms NOT, AND, EQ, NEQ, and OR calculate timing for their respective Verilog operations, while RESOLVE calculates timing for multiple drivers, and DEFAULT calculates timing for non-bitwise operations (i.e. +, –, *, /, %). Table T-6 shows the output of the bitwise AND (&) operator based on the eight states listed in Table T-4. As AND is a communicative operator, the table is symmetric along its diagonal. Tables for the other operators are constructed similarly and are shown in Attachment A.

TABLE T-6

Operator Table for AND (&)

| | P | p | N | n | E | 1 | 0 | — |
|---|---|---|---|---|---|---|---|---|
| P | p | p | N | E | E | p | 0 | p |
| p | p | p | N | E | E | p | 0 | p |

TABLE T-6-continued

Operator Table for AND (&)

| P | p | N | n | E | 1 | 0 | — | |
|---|---|---|---|---|---|---|---|---|
| N | N | N | N | N | N | N | 0 | N |
| n | E | E | N | n | E | n | 0 | n |
| E | E | E | N | E | E | E | 0 | E |
| 1 | P | p | N | n | E | 1 | 0 | — |
| 0 | 0 | 0 | 0 | 0 | 0 | 0 | 0 | 0 |
| — | p | p | N | n | E | — | 0 | — |

This arithmetic is used to statically propagate the timing from the inputs of a chip to all of its Memory Elements (i.e. latches, flip flops) on the chip. The timing is propagated through all continuous assignments and through all module instantiations. If a loop is encountered during this timing analysis, then the loop is scanned for all edges that could possibly affect the timing. This resultant static timing is called a waveform, and is used to schedule the Memory Elements (e.g. the activity or operation of the latches and flip flops (FFs).

Consequently, all memory elements that are driven by a clock (i.e. scheduled with a "P" or "N") are executed directly in the correct time-slot. All memory elements that are driven by a gated clock (i.e. scheduled with a "p", "n", or "E") are conditionally executed in the correct time-slot.

Combinational logic (i.e. continuous assignments and combinational "always" blocks) are executed as needed for the memory elements. Additionally, the static waveform is calculated for the controlling expressions of all MUXes at compile time. Consequently, if the controlling expression of a MUX is a constant in a given time-slot, then VCX 50 can generate an unconditional assignment instead of a conditional assignment.

Figure 13:
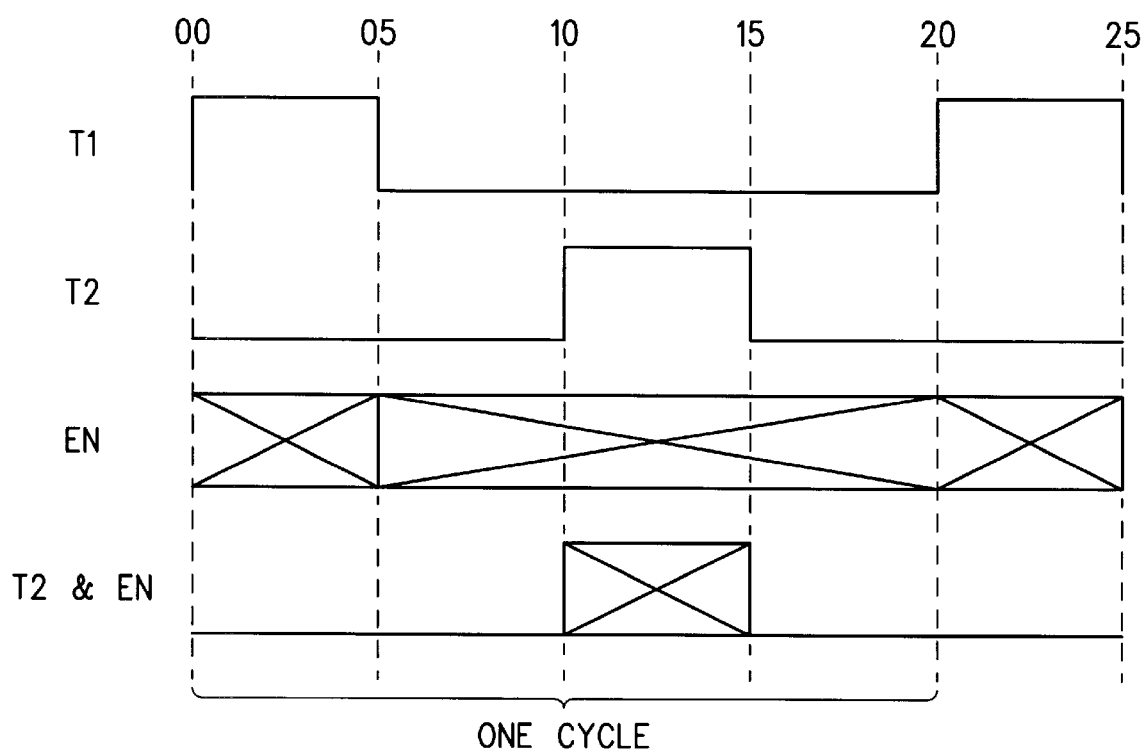
FIG. 13 is a timing diagram matching the waveforms illustrated in Table T-7 in accordance with the present invention.

FIG. 13 is a timing diagram matching the waveforms shown in Table T-7. The cycle is 20 units long, with the first five units shown repeating at time slots 20 through 25. In the figure and table, there are three input signals: clocks "T1" and "T2", and enable "en". The fourth line shows the effect of applying the bitwise AND operator, as was shown in Table T-6, to the "T2" and "en" signals.

TABLE T-7

FIG. 13 Waveform

| Signals | 00000000011111111112<br>12345678901234567890 |
|---|---|
| T1 | P1111N00000000000000 |
| T2 | 0000000000P1111N0000 |
| en | -----E-------------- |
| T2 & en | 0000000000p----N0000 |

The advantage of this acyclic arithmetic is obvious here. During time periods 1 through 10 and 17 through 20, any conditional logic depending on "(T2 & en)" can be suppressed since it will never be executed. During time periods 12 through 15, the product of the two signals can be determined based solely upon the value of the enable ("en") signal. Finally, in time slot 11, there cannot be, and in time slot 16 there will be a negative edge. So, for example the body of the following statement would only be executed conditionally in time slots 10 through 15:

always@posedge (T2 & en)

Figure 14:
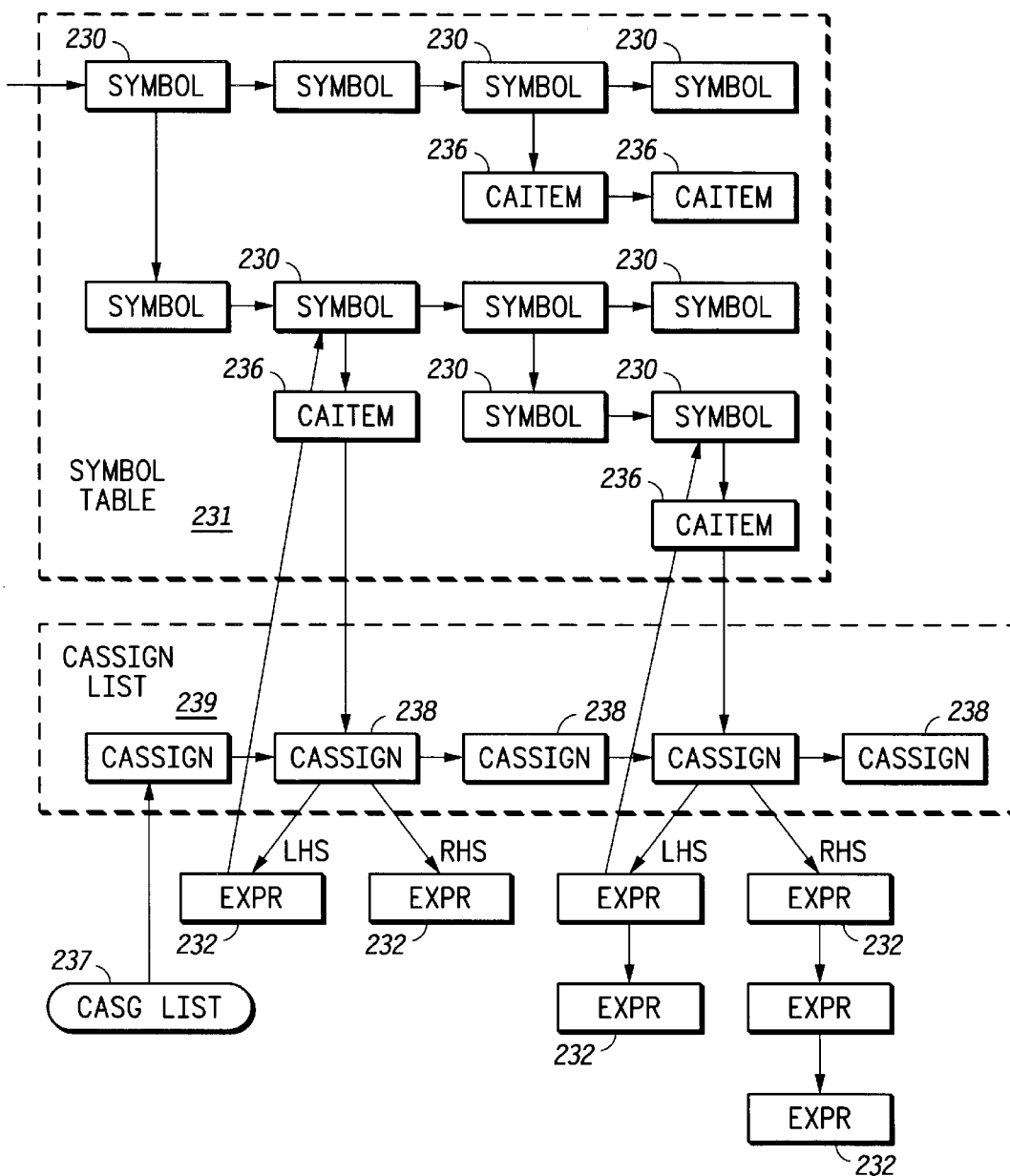
FIG. 14 is a data structure diagram that illustrates the lists built to process continuous assignments in FIG. 4.

FIG. 14 is a data structure diagram showing the lists built to process continuous assignments in step 114 in FIG. 4. Continuous Assignments are used in Verilog to express invariants. It is primarily used to define the combinational logic in the circuit. For example, an assignment of the form:

assign a=b & c expresses the logic of a two input "AND" gate. Ignoring gate delays, wire "a" always has a value equivalent to the values of wire "b" AND wire "c", or to rephrase, wire "a" only has a value of "1" if both wire "b" and wire "c" have values of "1", otherwise it has a value of "0".

Continuous assignment statements in Verilog (and MRTL) each have a Left Hand Side (LHS) and a Right Hand Side (RHS) separated by an equal ("=") sign. For example, in the above assignment statement, wire "a" is on the LHS, while "b&c" is on the RHS. Verilog (and again MRTL) differ from procedural languages such as C in how the LHS is defined. It should be noted that variables may be defined to be more than one bit long. Also, the results of many operations result in additional bits. So, Verilog assigns the results of the computation on the RHS to the left side from right to left. In other words, the right most variable on the LHS receives the least significant bits from the RHS. The following is an example of a one bit adder with carry:

assign {a, b}=c+d

Wire "b" receives the result of the addition, and "a" receives the carry. This can be rewritten as:

assign b=c ^ d //b=c XOR d assign b=c & d //a=c AND d

In these assignment statements, wires "a" and "b" are on the LHS, and wires "c" and "d" are on the RHS of the equations. Finally, any bits generated beyond those "captured" on the LHS are lost.

The Continuous Assignment (CASSIGN) list 239 is comprised of a forward linked list of CASSIGN items 238 linked from a CASG LIST queue head 237. There is one CASSIGN item 238 for each continuous assignment in the model. Each CASSIGN item 238 has a Left Hand Side (LHS) and a Right Hand Side (RHS) pointer field. Each LHS and RHS pointer field points at a tree of linked Expression (EXPR) items 232, one EXPR item 232 for each expression element on the corresponding side of the equal ("=") sign. Each EXPR item 232 has a pointer field as a link to the corresponding SYMBOL item 230. Each SYMBOL item 230 linked to an EXPR item linked to an LHS pointer field also contains a field linking it to a forward linked list of Continuous Assignment Item (CAITEM) items 236. Each CAITEM item 236 is linked back to the corresponding CASSIGN item 238. Note that this design supports multiple occurrences of the same symbol on the LHS of continuous assignments. This is most useful in supporting multiple assignments to different ranges, or multiple conditional assignments. A CAITEM list is associated with each symbol. Using the CAITEM list allows easy determination of which continuous assignments can be assigning a value to a particular symbol. This is especially useful in the levelization recursion.

Figure 16:
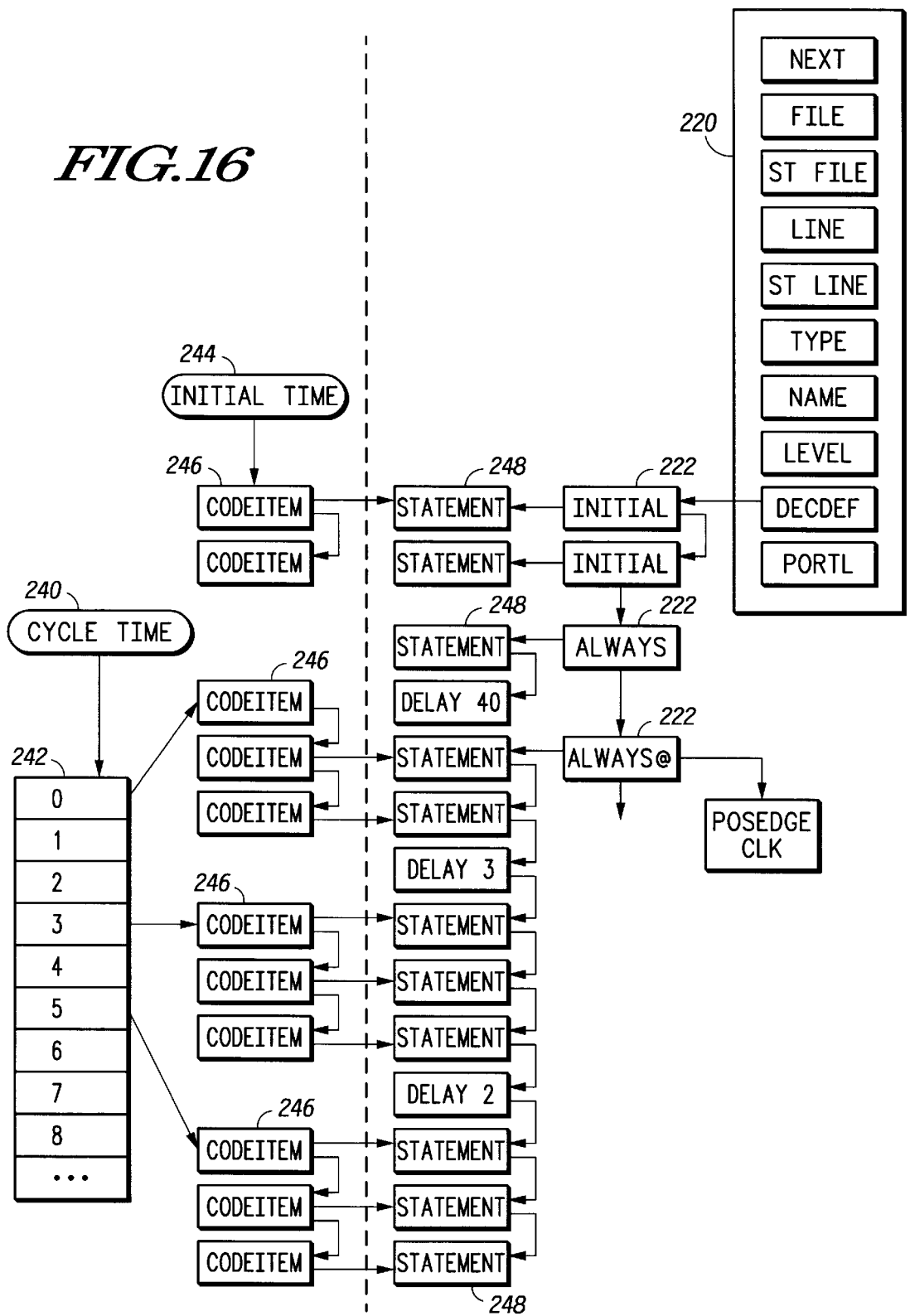
FIG. 16 is a data structure diagram that illustrates the primary lists utilized in Module Scheduling.

FIG. 15 is a flow chart showing Module Scheduling in step 124 in FIG. 4. FIG. 16 is a data structure diagram showing the primary lists utilized in Module Scheduling.

Module Scheduling first creates a Cycle Time array 242 of pointers, step 160 and a Cycle Time Slice array (not shown), step 162, of pointers, both used to reference CODEITEM item 246 lists. Both arrays 242 contain one item for each possible time slot. Each entry in the Cycle Time Slice array points to a time slice structure which has pointers to the start and end of each slice within the given time slot. The number of possible time slots is determined in the disclosed embodiment from the "/*!vcx time" statements described above, but may alternatively be determined directly from the Verilog/MRTL model. In the disclosed embodiment, there are four Cycle Time Slices per Cycle Time slot. Thus if there are 20 possible time slots, there would be 20 entries in both arrays. The four Cycle Time Slices per Cycle Time slot are
1) latches,
2) independent "always" blocks,
3) dependent "always" blocks, and
4) nonblocking assignments.

Each entry in the Cycle Time array 242 is a pointer to a list of CODE Items 246 that is created by joining all slices for the given time slot from the corresponding Cycle Time Slice entry. The number of time slots is determined from the least common multiple of the defined clocks. Thus, if a clock of 10 and a clock of 15 are required, the number of time slices would be 30, allowing the clock of 10 units to be repeated three times, and the clock of 15 repeated twice in one cycle through the Cycle Time slot array 242. The array index into the Cycle Time Slice array and the Cycle Time array 242 is a time slot.

The Model Hierarchy 219 is traversed, scheduling all "initial" blocks into the Initial Time list 244, and all "always" blocks into the appropriate slices of the appropriate Cycle Time Slice array, step 164. The Time Slot is determined for each "always" block by both the timing of the event-expression that triggers the "always" block, and by any delays within the "always" block, step 166.

The CODEITEM items 246 are forward linked as a list into the appropriate Cycle Time Slice array entries. The CODEITEM items 246 each reference STATEMENT items 248. Each STATEMENT item 248 corresponds to a single statement in a given module. On the other side of FIG. 16, the Module Definition items 220 in the Module Hierarchy 219 contain DECDEF field links to forward linked lists of DECDEF items 222. The DECDEF items 222 for Verilog/MRTL statements that affect timing, such as "initial" and "always" statements have links to corresponding STATEMENT items 248. Additionally, CODEITEM items 246 are forward linked as an Initial Time list 244. This list contains CODEITEM items 248 corresponding to statements in "initial" sections of code.

After the Cycle Time Slice array has been filled in step 164 with links to forward linked lists of CODEITEM items 246, the possibly four slices per Cycle Time Slot are formed into a single forward linked list for each time slot, and that forward linked list is chained into the appropriate Cycle Time Array 242 item, step 168. When more than one Cycle Time Slice in a Cycle Time Slot point at lists of CODEITEM items 246, the slices are combined in the order listed above (i.e. latches, independent "always" blocks, dependent "always" blocks, and nonblocking assignments).

Figure 17:
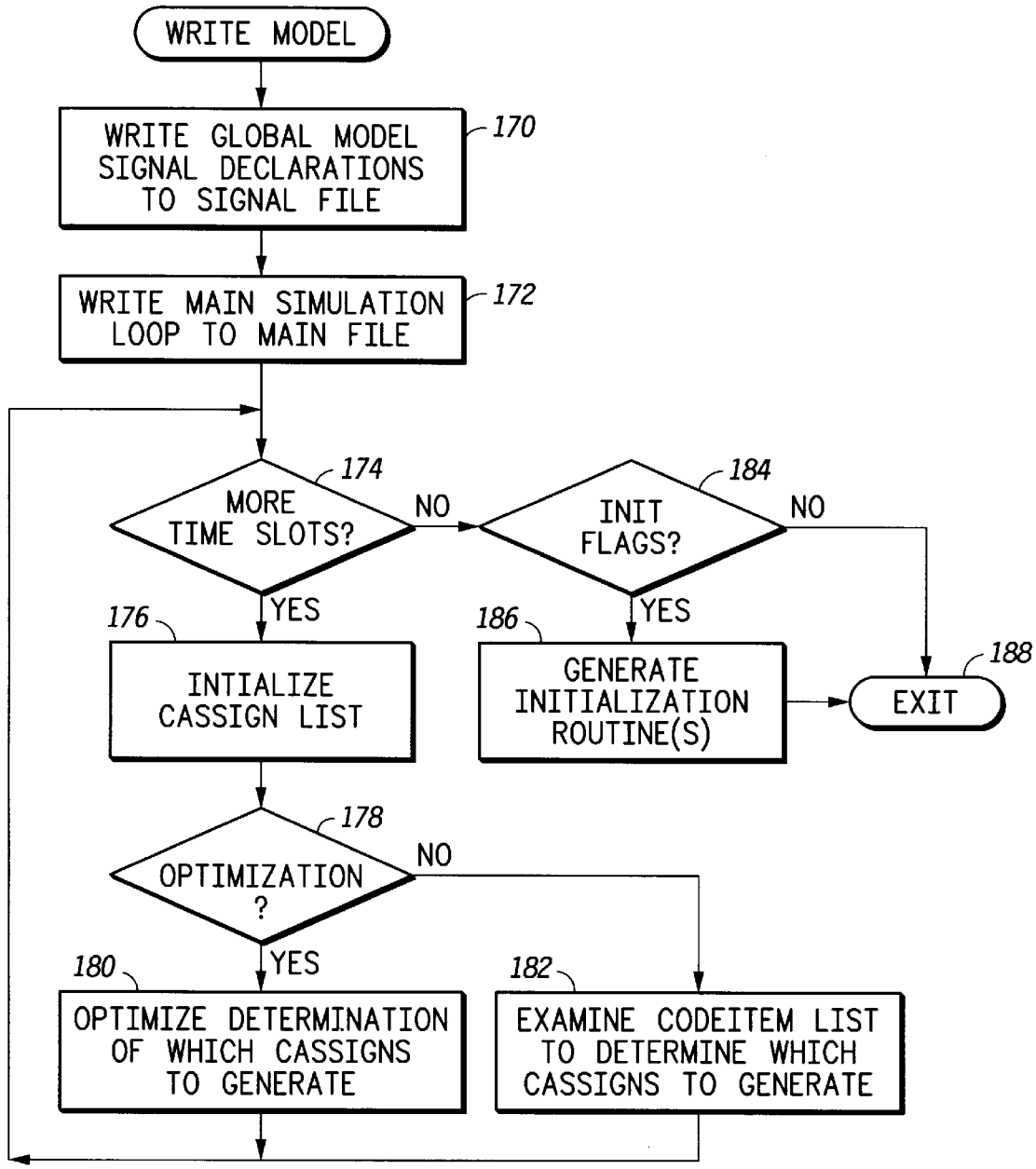
FIG. 17 is a flow chart that illustrates the operation of the write module in FIG. 4.

FIG. 17 is a flow chart showing the operation of the write module in step 128 in FIG. 4. Global model signals are written to one or more Signal files 70, step 170. Concatenation signal declarations are written to the concatenation file (CTMP) 62. The main simulation loop is written to the MAIN program file 68, step 172. The main loop will usually consist of calls to initialization routines, followed by the main program loop. The main program loop is an infinite loop that contains "delay" statements with delays equal to the number of entries in the Cycle Time Slot 240 array. One or more functions are invoked for each Cycle Time Slot 240 array item that contains scheduled operations.

A loop is then entered, scanning through the Cycle Time Slot 240 array for time slots with links to CODEITEM item 246 lists, step 174. As long as not all time slots have been processed, step 174, traversing of the Continuous Assignment (CASSIGN) item 238 list 237 is initialized, step 176. A time slot file 72 is opened for that time slot. A check is then made as to the level of optimization to be performed, step 178. The optimization performed at this point depends on the VCX 50 processor options specified. If no optimization is requested, the CODEITEM items 246 forward linked to the Cycle Time Slot 240 array entry are examined to determine which CASSIGN statements to generate, step 182. Levelization is performed. Otherwise, the CASSIGN statements generated are optimized, step 180, depending on optimization level requested. Note that a VCX program 50 user is allowed to specify the maximum size of the time slot files 72. When this size is exceeded, the current file is closed, and a new file is opened. The link invoking the code in the new file is within the Main loop. At the end of the CASSIGN processing, the time slot (TSLOT) file 72 is closed. Pathnames for each TSLOT file created are added to the Catalog (CFILE) file 60.

When no more time slots remain to be processed, step 174, initialization flags are checked, step 184. If initialization is required, the appropriate initialization routine is generated, step 186, and written to the Storage Element Initial Value (SEIV) file(s) 64. Just as with the time slot files 72, the VCX 50 user can specify the maximum size of SEIV files 64. Pathnames for the SEIV file(s) are written to the Catalog (CFILE) file 60. In either case, the routine then exits, step 188.

The VCX program 50 allows for a number of initialization options. Uninitialized variables can be initialized to binary zero (0), binary (1), or to pseudo-random values based on a specified random number seed. This initialization flexibility provides the ability to test whether all of the variables, registers, latches, flip flops, etc. that need to be initialized have been. Given the same Input Vectors 42, a properly specified Model 40 should be able to operate the same, and give the same results, regardless of whether the default initialization is to zero (0), ones (1), or to random values. If this is not the case, there is probably a problem with the specification of the Model 40.

Figure 18:
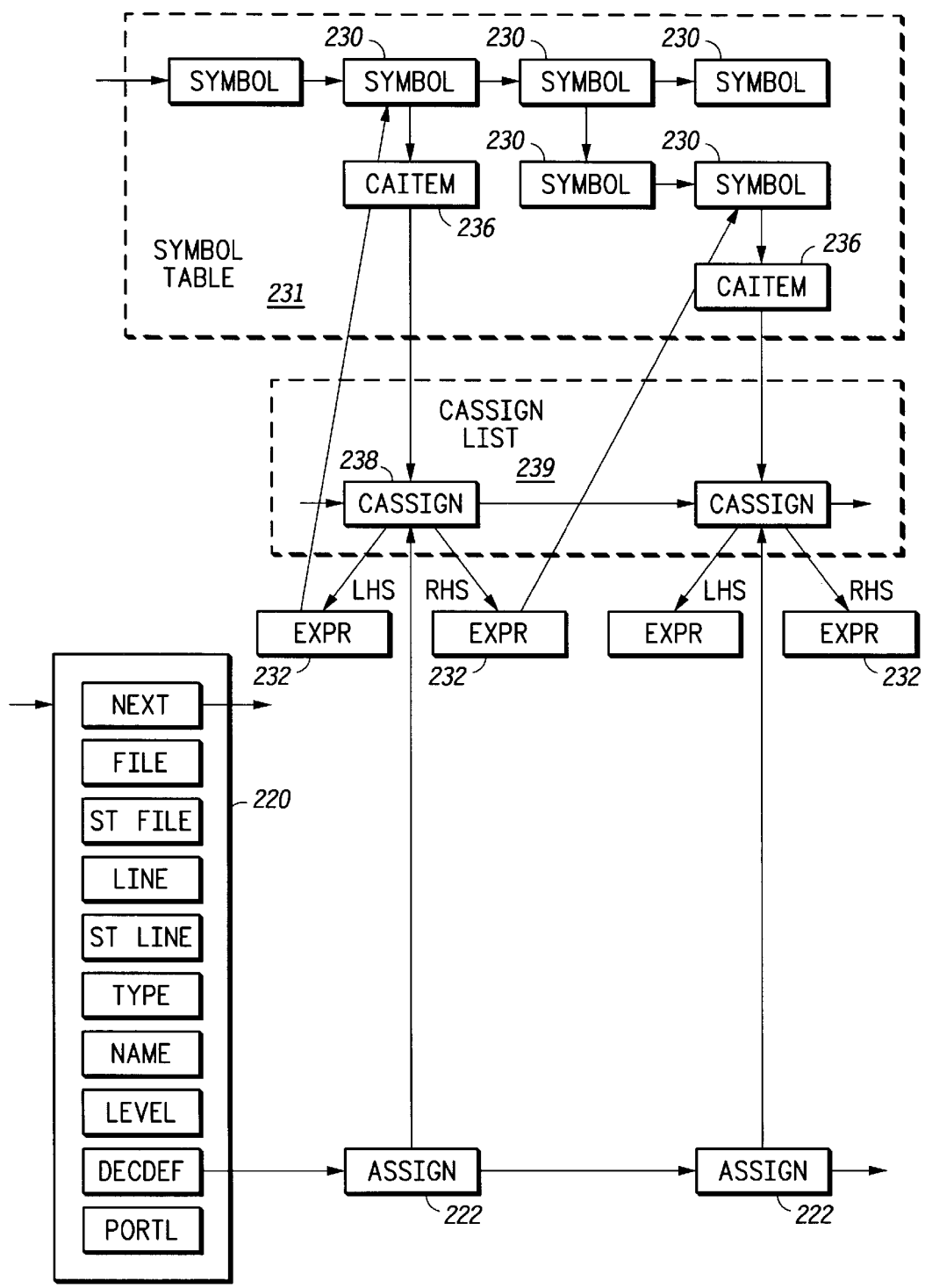
FIG. 18 is a data structure diagram that illustrates lists used to determine which Continuous Assignments to generate of FIG. 17.

FIG. 18 is a data structure diagram showing lists used to determine which Continuous Assignments to generate in step 180, 182 of FIG. 17. Two Continuous Assignment (CASSIGN) items 238 are shown. Each CASSIGN item 238 has a forward linked list of EXPR items 232 linked to its Left Hand Side (LHS) and to its Right Hand Side (RHS). The EXPR items 232 point at SYMBOL items 230 describing the symbols in the expressions on the LHS and RHS of each continuous assignment. The SYMBOL items 230 have links to CAITEM items 236, which in turn are linked back to the CASSIGN items 238 in which the symbol occurs on the Left Hand Side (LHS) of the continuous assignment.

Starting then with the SYMBOL item 230 pointed at by the left most EXPR item 232, the chain is followed from the SYMBOL item 230 to the CAITEM item 236 to the corresponding CASSIGN item 238. Each of the EXPR items 232 on the RHS of this CASSIGN item 238 are followed, using the RHS EXPR items 232 to link to the SYMBOL items 230 corresponding to the symbols in the RHS expressions. The dependencies of these SYMBOL items 230 are followed back through CAITEM items 238, CASSIGN items 238, RHS EXPR items 232, and again SYMBOL items 230. At some point, the SYMBOL items 230 will not point at CAITEM items 238. At this point, the algorithm backtracks, outputting C code to implement the continuous assignments. This algorithm is naturally implemented in C in recursion, with each level SYMBOL item 230 being one level of recursion.

The result of this technique is Levelization. The continuous assignment statements have been converted into sequentially executed C code statements. The C code assignments are not generated for execution until all their dependencies have been resolved. And finally, only those continuous assignment statements necessary for evaluating Combinational Logic that is required for inputs that may be triggered during a given time slot. Note that code to implement the same continuous assignment statements may be generated in different time slots. Indeed, without one of the optimization techniques discussed herein, it is possible that code to implement the same continuous assignment statements may be unnecessarily generated.

Figures 19, 21, 22:
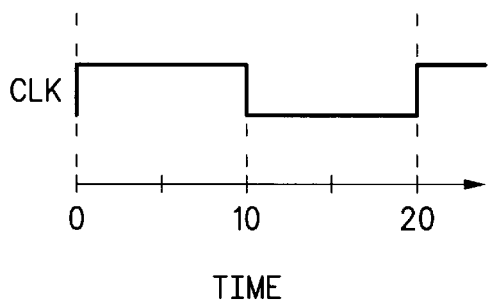
FIG. 19 is a table that illustrates Verilog code and the resulting translated C code in accordance with the present invention.
FIG. 21 is a timing diagram that illustrates operation of the clock used in FIG. 19.
FIG. 22 illustrates generated (pseudo) C code resulting from Levelization of the Verilog code in FIG. 19.

FIG. 19 is a table showing Verilog code and the resulting translated C code. It demonstrates Levelization and low level optimization. Continuous assignments in Verilog can occur in any order. In a procedural language such as C, this is not the case. Rather, assignment statements can be viewed as having Left Hand Sides (LHS) and Right Hand Sides (RHS) separated by an equal sign. The values on the Right Hand Side (RHS) are assigned to the variables on the Left Hand Side (LHS) of assignment statements. Thus, when generating C code, all of the variables on the Right Hand Side (RHS) of the assignment need to have been evaluated before they can be assigned to the Left Hand Side (LHS). This is recursive, since the variables on the Right Hand Side (RHS) of one assignment statement will often be found on the Left Hand Side (LHS) of another assignment statement.

In understanding FIG. 19, one can start by looking at the Procedural Logic, where flip flop "ff1" is assigned the value of wire "a". At this point, wire "a" does not as yet contain valid information. This is acquired by reference to the Continuous Assignment statement:

a=(b & c)

where the wire "a" is continuously assigned the value of wire "b" ANDed with the value of wire "c". But neither wires "b" nor "c" as yet contain valid information. Rather, they are both controlled by Continuous Assignment statements:

b=~d
c=e|f|g

Not all of the inputs to wire "c" have yet been evaluated. In particular, wire "g" has yet to be evaluated. Wire "g" variable is continuously assigned in the assignment statement:

g=h & i

The solution to this problem of dependencies disclosed herein is to generate code to evaluate continuous assignment statements for variables in the order required, which may be g, c, b, and a as shown in FIG. 19. Note that code to evaluate continuous assignment statements for "j" and "x" is not generated since these variables (or "wires") are not required directly or indirectly by the Memory Elements. This concept is displayed graphically as cones 314, 316 of Combinational Logic 300 in FIG. 27.

Figure 20:
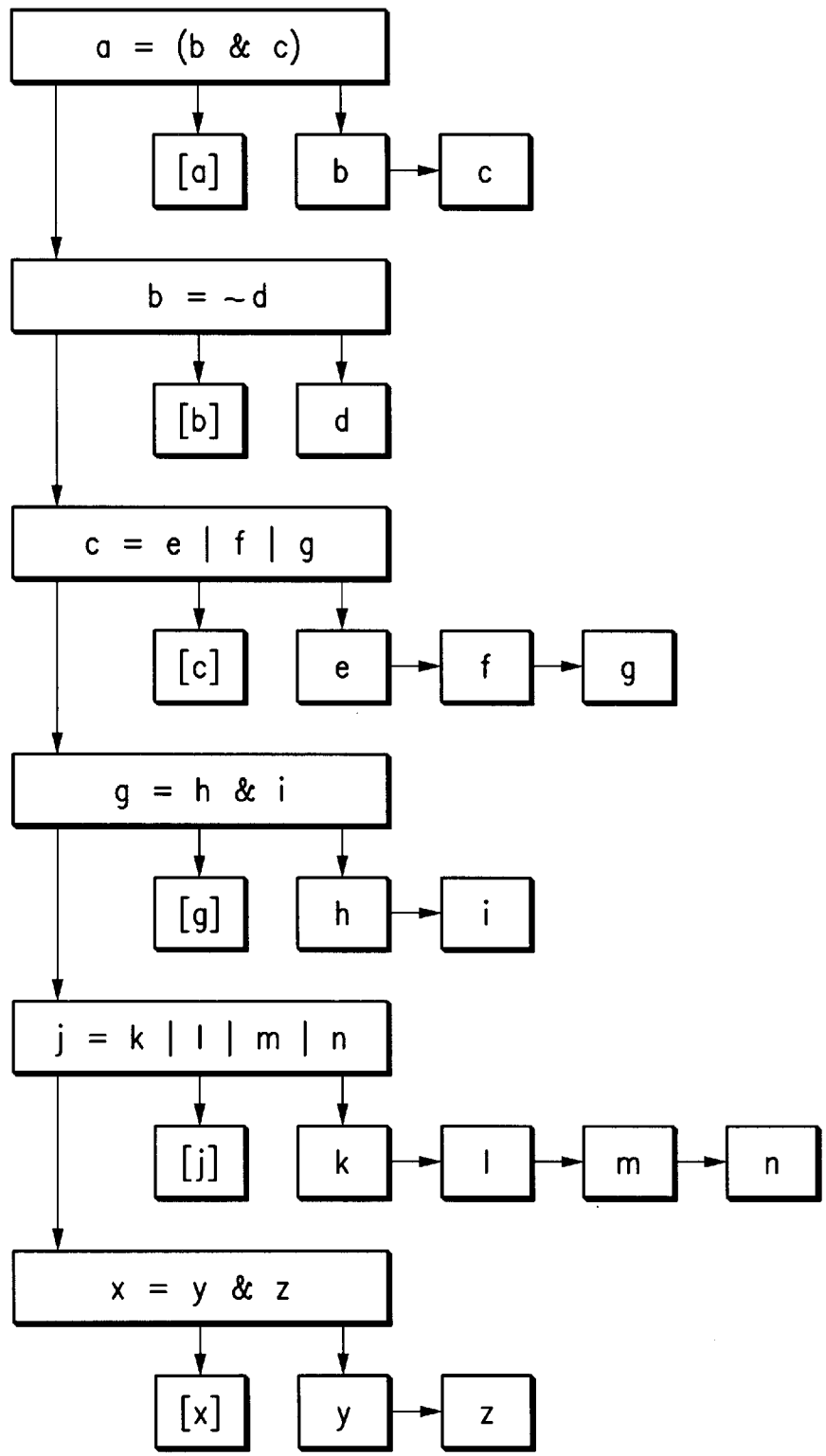
FIG. 20 is a data structure diagram that illustrates the continuous assignment and expression lists containing information from the Verilog code in FIG. 19.

FIG. 20 is a data structure diagram showing the continuous assignment and expression lists containing information from the Verilog code shown in FIG. 19. Note should be made that the lists shown here have been simplified for illustrative purposes as compared to the Continuous Assignment lists shown in FIG. 18. In actual implementation, each continuous assignment would consist of a SYMBOL item 230, a CAITEM item 236, CASSIGN item 238, and one or more LHS and RHS EXPER items 232. The RHS EXPR items would point to SYMBOL items 230 upon which that continuous assignment depended. All of the Continuous Assignments have a left Hand Side (LHS) and a Right Hand Side (RHS) in the FIG. 20, the LHS variables are listed between square brackets "[" and "]". The example in this figure includes all of the Continuous Assignments in the example in FIG. 19.

FIG. 21 is a timing diagram showing operation of the clock used in FIG. 19. FIG. 22 shows generated (pseudo) C code resulting from Levelization of the Verilog code shown in FIG. 19. The clock has a cycle of 20 units. Using the convention shown above, this clock (clk) can be defined as:

clk: posedge, wait 10, negedge, wait 10;

Thus, the clock ("clk") has a positive edge (posedge) at zero, is high until time slot ten (10) at which time there is a negative edge (negedge). The clock is low (0) for remaining ten clock units or time slots. The model shown can be seen as having a twenty time slot cycle. Referring back to FIG. 19, the procedural logic includes:

always@(posedge clk)
if (enb)
ff1=a;

A positive edge is encountered at time slot zero (0) in each full twenty time slot cycle. In time slot zero (0), if the enable ("enb") wire is active, the flip-flop ("ff1") receives the value of wire "a". The remainder of the assignment code in the generated code is required to provide values for wire "a". At the bottom of the loop, the time is incremented by 20, to correspond with the length of the cycle.

Figure 23:
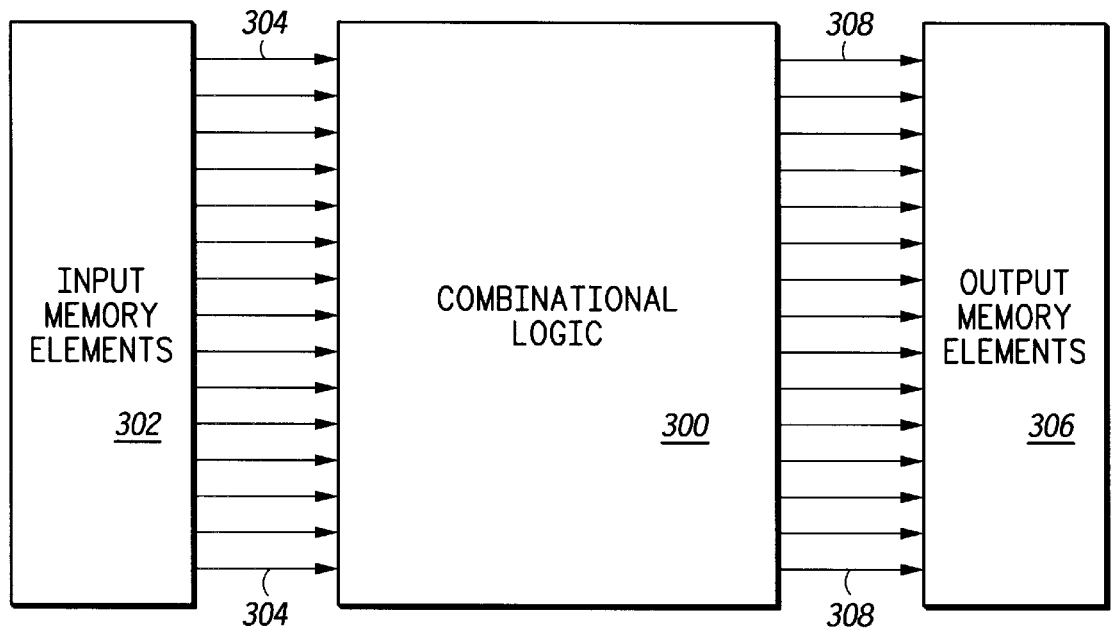
FIG. 23 is a block diagram that illustrates a simplified model as it exists during a single time slot in accordance with the present invention.

FIG. 23 is a block diagram showing a simplified model as it exists during a single time slot. Integrated circuits are composed of essentially two types of elements: Combinational Logic elements, and Memory Elements. Memory Elements include registers, latches, and flip flops. They remember their state from one enablement or triggering until the next. Then at that next triggering the Memory Elements transition to a new state based on their input values. Distinguish this with Combinational Logic which (in a perfect model) has no memory. Rather, input changes to the Combinational Logic result in immediate (ignoring gate propagation delays) changes to the output to the Combinational Logic.

At each time slot in the execution of a Verilog model, the model can be simplified to consist of Input Memory Elements 302 coupled 304 to Combinational Logic 300, which in turn is coupled 308 to Output Memory Elements 306. The Input Memory Elements 302 contain all of the possible inputs to the system. Within a brief period of time (i.e. a single time slot interval), none of the Input Memory Elements 302 will change. It should be noted that inputs to the system are included in the Input Memory Elements 302, with the implied assumption that these inputs cannot vary within a single time slot interval. Likewise, system outputs are included within the Output Memory Elements 306 under the assumption that outputs from the system being modeled are not sampled within any single time slot interval.

Figure 24:
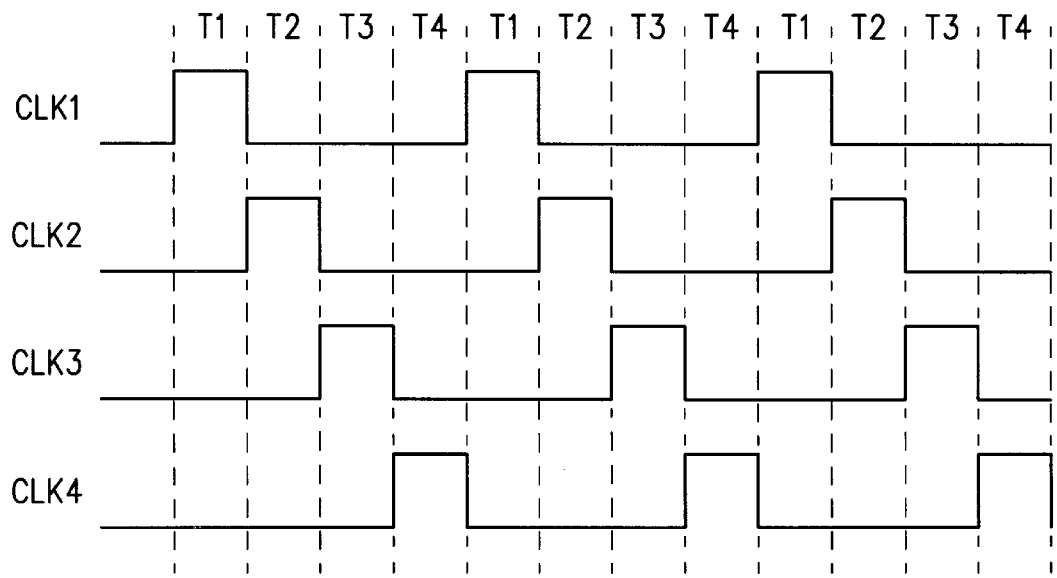
FIG. 24 is a timing chart that illustrates four different clocks or clock cycles in accordance with the present invention.

FIG. 24 is a timing chart showing four different clocks or clock cycles. This is to illustrate logical operation of time slots. It is useful in simulating a hypothetical with four different clocks or clock cycles. The clocks are defined below:

```
/*!vcx time
  begin
    clk1: posedge, wait 10, negedge, wait 30;
    clk2: wait 10, posedge, wait 10, negedge, wait 20;
    clk3: wait 20, posedge, wait 10, negedge, wait 10;
    clk4: wait 30, posedge, wait 10, negedge;
  end
*/
```

Figure 25:
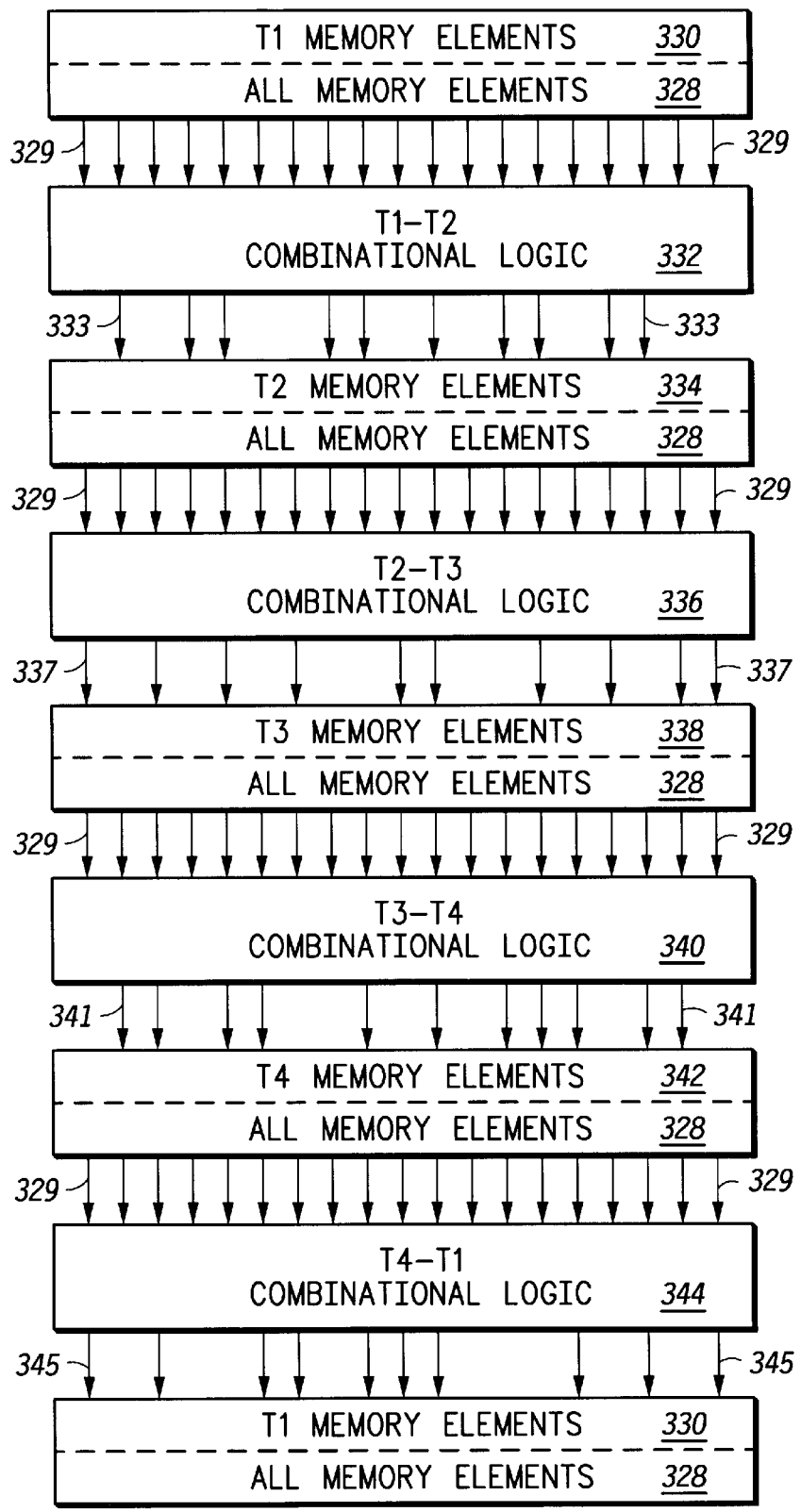
FIG. 25 is a block diagram that illustrates a simplified model applicable to the four clock cycles in FIG. 24.

FIG. 25 is a block diagram showing a simplified model applicable to the four clock cycles shown in FIG. 24. As with FIG. 23, the model can be split into two types of components: Memory Elements, and Combinational Logic. The set of All Memory Elements 328 is coupled 329 with the T1–T2 Combinational Logic 332. The outputs 333 of the T1–T2 Combinational Logic 332 are responsively coupled to the T2 Memory Elements 334. These are the Memory Elements that can be changed at T2. For example, they may be latches or flip flops triggered by the positive edge of T2 in FIG. 25. The lower number of arrows in the Combinational Logic 332 outputs 333 as compared to inputs 329 is to indicate that not all memory elements will typically be triggered to accept new data on every clock cycle, while the outputs of all memory elements are typically available during all clock cycles. The dotted line between the T2 Memory Elements 334 and All Memory Elements 328 is similar, indicating that the T2 Memory Elements 334 are the subset of All Memory Elements 328 that are triggered by clock C2.

Similarly, the T2–T3 Combinational Logic 336 is responsively coupled 329 to All Memory Elements 328, and are coupled to and provide input 337 to the T3 Memory Elements 338. The T3–T4 Combinational Logic 340 is responsively coupled 329 to All Memory Elements 328, and is coupled to and provides input 341 to the T4 Memory Elements 342. The T4–T1 Combinational Logic 344 is responsively coupled 329 to All Memory Elements 328, and is coupled to and provides input 345 to the T1 Memory Elements 330.

It should be appreciated here that this model represents a generic Integrated Circuit (IC) model with a four phase or cycle clock. The T1 Memory Elements 330 are triggered by the C1 clock, the T2 Memory Elements 334 are triggered by the C2 clock, the T3 Memory Elements 338 are triggered by the C3 clock, and the T4 Memory Elements 342 are triggered by the C4 clock.

Figure 26:
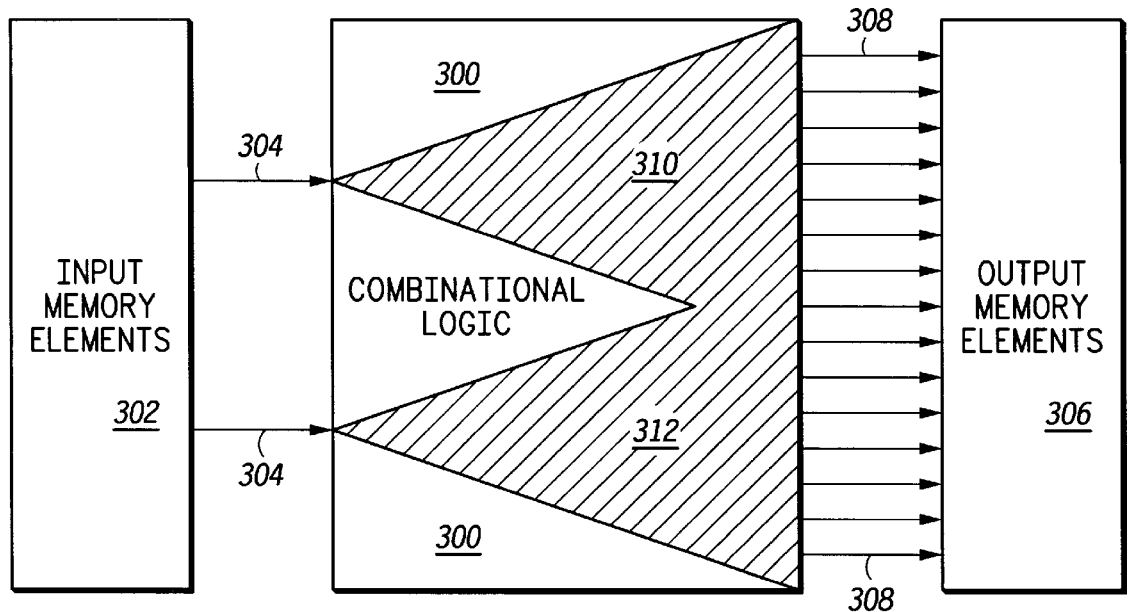
FIG. 26 is a block diagram that illustrates a simplified model for a single time slot in which continuous assignment results are "pushed" from input Memory Elements to output Memory Elements in accordance with the present invention.

FIG. 26 is a block diagram showing a simplified model for a single time slot in which continuous assignment results are "pushed" from input Memory Elements to output Memory Elements. Two Input Memory Element 302 outputs 304 are shown. This is to indicate that two Memory Elements 302 provide input to the Combinational Logic 300. The two shaded cones 310, 312 show the ripple effect of making changes to the inputs 304. Thus, in order to evaluate the continuous assignments primarily comprising the Combinational Logic 300 in the model, only the logic in the cones 310, 312 needs to be evaluated. This usually done by evaluating continuous assignment statements from the point of the cones forward to the base of the cones 310, 312. The order of evaluation, from input to output, is what gives the method its "push" name.

Figure 27:
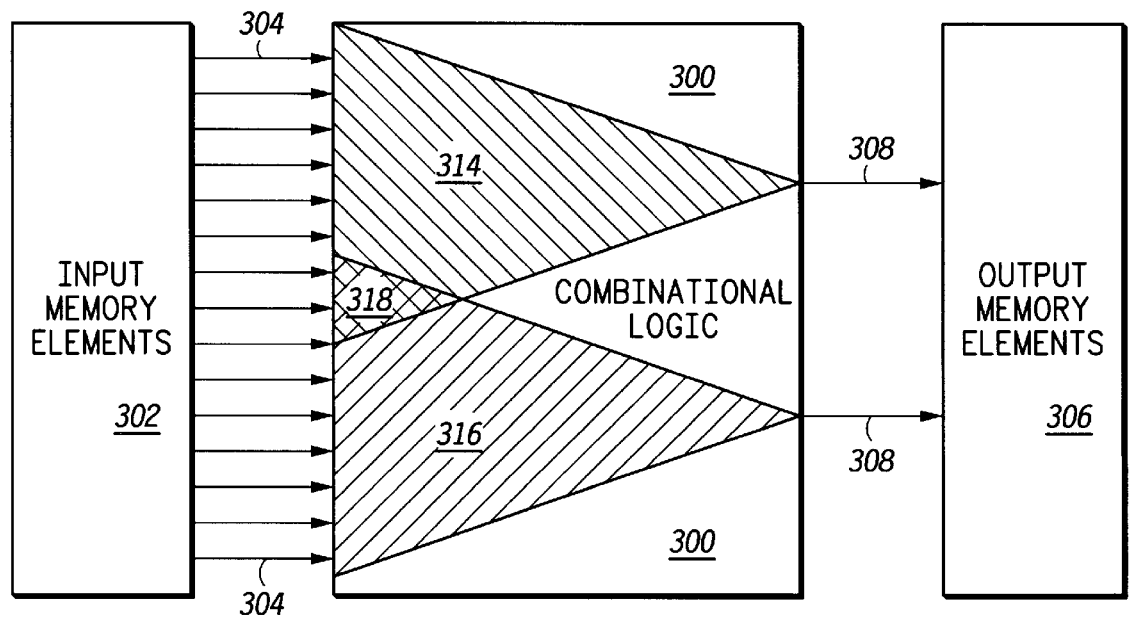
FIG. 27 is a block diagram that illustrates a simplified model for a single time slot in which continuous assignment results are "pulled" from input memory elements by output memory elements in accordance with the present invention.
Figure 28:
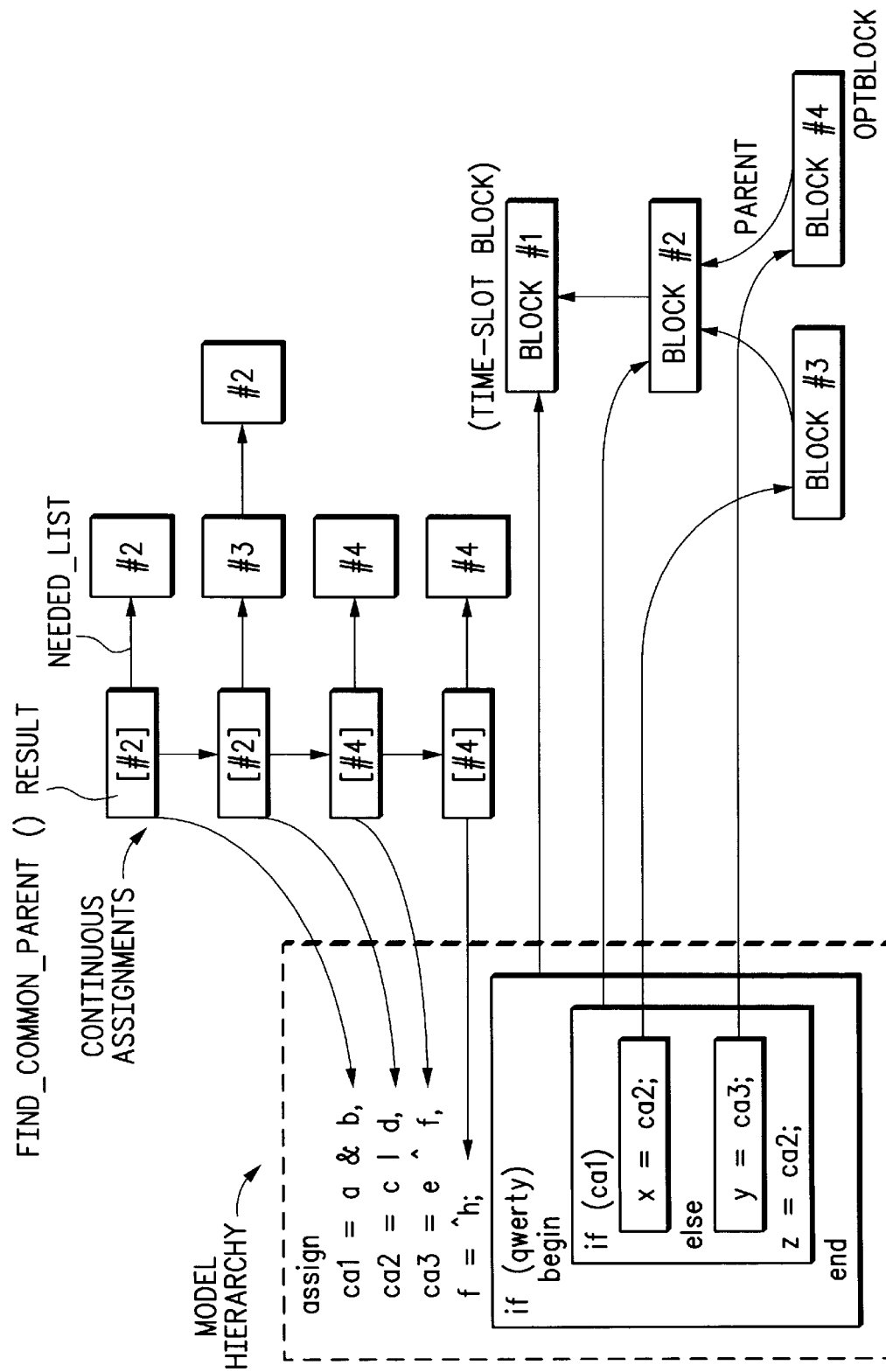
FIG. 28 is a block diagram that illustrates another optimization in accordance with the present invention.

FIG. 27 is a block diagram showing a simplified model for a single time slot in which continuous assignment results are "pulled" from input memory elements by output memory elements. Two outputs 308 are shown, corresponding to two Output Memory Elements 306 triggered on this time cycle. Two cones 314, 316 of Combinational Logic 300 are shown, indicating the logic required to provide input to the two Output Memory Elements 306.

One thing that must be appreciated here is that evaluation is not necessary for any Combinational Logic 300 elements that do not directly or indirectly provide input 308 to any Output Memory Element 306 triggered during a given time period. Thus, a first level optimization can be performed on the generation of code by eliminating evaluation of Combinational Logic 300 that does not directly or indirectly provide input to such an Output Memory Element 306. This is accomplished using the Levelization described above to generate C code to evaluate the two cones 314, 316 of Combinational Logic 300. This is done by first identifying Output Memory Elements 306 that can possibly change before the next clock cycle. The combinational logic 300 is followed back from these potentially changed Output Memory Elements 306 until the Input Memory Elements 302 are reached, generating only enough C code to provide the results needed directly or indirectly by the Output Memory Elements 306. This approach gets its name of "pull" due to being driven by which Output Memory Elements 306 are triggered in a time slot, as contrasted with the "push" approach shown in FIG. 23.

Additional optimization can be obtained by eliminating the generation of code for evaluating the overlap 318 between different "cones" 314, 316 of Combinational Logic 300. Code to evaluate Combinational Logic in the intersection 318 of the two cones 314, 316 is naturally generated twice using the Levelization disclosed above. As the Inputs 304 to the Combinational Logic 300 do not change within a given clock cycle, once computed, the values Combinational Logic 300 elements in the overlap or cone intersection 318 cannot change within the clock cycle or time slot. The result is that the second (and any subsequent) execution of code to evaluate the combinational Logic 300 elements in the overlap or cone intersection 318 is redundant. The above discussion seriously understates the advantages of this optimization, since in most circuits of interest, there may be hundreds, if not thousands of Output Memory Elements 306 triggered during a single clock cycle. The result is that many such cones overlap in many of the same places.

One implementation of the above optimization is to add a single bit field to each of the Continuous Assign (CASSIGN) items 238 in the CASSIGN List 237. At the start of each clock cycle, the CASSIGN List 237 is run, clearing the flag bit in each CASSIGN item 238. Then, when code for each Continuous Assignment is being generated during the Write Model phase 128 (see FIG. 29), the new flag in the appropriate CASSIGN item 238 is checked. If the flag is clear, the code for the assignment is generated, and the flag is set. Otherwise, the code generation is skipped. Other statements that generate code during clock cycles such as "always@", can be optimized in a similar manner.

A further enhancement of this optimization starts by understanding that Output Memory Elements 306 are usually Input Memory Elements 302 in later time slots. This overlap can be seen by referring back to FIG. 22. Actual Memory Elements 328 such as latches, flip flops, and registers, are not as a rule triggered in every time slot. Often they are triggered only once per major clock cycle (i.e. in only one time slot). From this follows that code for evaluating a given Combinational Logic 300 element or expression need not be generated in a given time slot if none of the inputs to that Combinational Logic 300 element or expression has changed since a previous time slot in which the Combinational Logic 300 element was evaluated. In other words, only generate code for Combinational Logic 300 elements when output from those elements is required through Levelization, and when their inputs have changed since the last time these elements were evaluated.

This optimization can be performed by slightly modifying the previous method. Instead of a single bit field in each CASSIGN item 238, the CASSIGN items 238 each contains a field that contains a time slot index. The model is initialized by setting this field in each CASSIGN item 238 to a value less than the system start time. Then, whenever an Output Memory Element 306 is potentially triggered and updated, the time slot index of the time slot being evaluated is stored in a list item describing the Output Memory Element 306. Any system inputs are treated as if they were updated in the current time slot. Then, whenever a CASSIGN item 238 is considered for generation, its last time of generation is compared with that of its inputs. If any of its inputs have changed since it was last evaluated, code to evaluate the CASSIGN is generated, and the time stamp for the CASSIGN item 238 is updated to indicate the current time. This is an extension of the Levelization discussed above. Note should be made to take care to compensate for the fact that the first time slot follows the last one, as shown in FIG. 25.

FIG. 29 is a block diagram showing another optimization. The original Verilog code contains several continuous assignment statements and a procedural decision statement.

```
assign
    ca1 = a & b,
    ca2 = c | d,
    ca3 = e ^ f,
    f = ^ h;
if (qwerty)
    begin
        if (ca1)
            x = ca2;
        else
            y = ca3;
        z = ca2;
    end
```

Without optimization, Levelization would generate the following C code:

```
f = ^ h;
ca3 = e ^ f;
ca2 = c | d;
ca1 = a & b;
if (qwerty)
    {
    if (ca1)
        x = ca2;
    else    y = ca3;
    z = ca2;
    }
```

This can be improved upon since not all of the assignment statements resulting from the continuous assignments need be executed in every case.

```
if (qwerty)
    {
    ca2 = c | d;
    ca1 = a & b
    if (ca1)
        {
        x = ca2;
        }
    else    {
        f = ^ h;
        ca3 = e ^ f;
        y = ca3;
        }
    z = ca2;
    }
```

Note a couple of things here. First, the "ca2", and "ca1" calculations have been brought within control of the "qwerty" signal test. The "ca3" and "f" calculations have been brought within control of the else branch of the "ca1" test. The "ca2" assignment couldn't be brought within the true branch of the "ca1" test (without loss of efficiency), even though required by wire "x" within that loop because it is also required by wire "z".

The above optimization is performed by dividing the model hierarchy into blocks. These blocks correspond to control flow blocks. In the above example, there are four blocks. Block #1 is the outer block. Code within that block is always executed. Within Block #1 is Block #2. It is only executed when the "qwerty" signal is asserted. Block #3 and Block #4 are both within Block #2. Block #3 is executed only when the "ca1" signal is asserted, while Block #4 is executed the remainder of the time that Block #2 is entered. The "ca3" assignment statement is only required in Block #4. So, that is where it is located. But the "ca2" signal is used both in Block #3 and in Block #2. The common parent of Block #3 and Block #2 is Block #2, so that is where the "ca2" continuous assignment statement code is generated.

This optimization technique can be implemented by building a data structure corresponding to the block structure of the Model 40. This block structure data structure has a block item for each control flow block in the flattened model. Each time slot is considered an outer level block. Within a time-slot, procedural "if" and "case" statements introduce new blocks, as do "?" operators when on the right side of assignment statements. The block items may be sequentially numbered in order to generate a unique ID for each block item. Alternatively, the memory addresses of the block list items can be used as the unique identifiers. Each block item also has a field that points at its parent block item, except for the block items representing the time slot item at the outer level. Note that parent block pointers associated with continuous assignment statements are subject to change as this optimization is performed.

The next phase requires generation of a "needed list" for each continuous assignment. This list contains the unique block IDs of each block which needs the continuously assigned values. The Model Hierarchy 219 is then traversed. For each required continuous assignment statement, the needed list is examined to determine the lowest level block common to all blocks in the list. This should also include examining any continuous assignment statements upon which this continuous assignment directly depends. This lowest level common block becomes the continuous assignment's corresponding block id. Whenever a continuous assignment is thus "moved" to a new block, it is necessary to revise the parent pointers of any lower-level blocks, and to re-check all of the continuous assignments upon which the moved continuous assignment depends.

During the code generation phase, whenever code generation for a new block is started, the CASSIGN item 238 list 237 is searched for continuous assignments that have block ID equal to that of the control flow block just entered. Code is generated for all continuous assignment statements with a block id matching that of the newly entered block. Care should be taken that normal Levelization is done within each block, making sure that code for dependent continuous assignment statements is generated after the code for continuous assignment statements upon which they depend has been generated.

During static analysis of a Verilog Model 40, loops may be detected. These static-loops may or may not exist at run-time, depending on the value of the controlling signals at run-time. As noted above, to the extent possible, the VCX program 50 suppresses or optimizes Combinational Logic controlled directly or indirectly by enabling signals, especially enabling signals that are dependent upon clock signals. Consequently, C code in the simulator-executable must contain all possible run-time options. This is handled by converting every combinational-assignment (both continuous assignments and combinational "always" blocks) to a function. In order to update a signal that is in a static loop, the function that writes to this signal is invoked. Additionally, for every signal that is both read in a function and is part of a static loop, another function is called to update that signal.

At run-time, the simulator executable 56 keeps track of which functions are called. If a loop does exist at run-time, then a run-time loop message is printed, and the last function in the loop is not executed. This means that run-time loops are not continuously executed until their data stabilizes.

The following example models a two-way bus. The Verilog assign statements form a static loop, however since the circuit designer writing the Verilog code presumably knows that the signals "rd" and "wr" are mutually exclusive, such a loop should not actually exist. By using the aforementioned combinational-assignment evaluation functions, as shown below, the evaluation of the assignments is delayed until simulation time and the loop is avoided. Note that if "rd" and "wr" were both true at the same time, then there would be a dynamic loop, which would be detected as previously described. First the Verilog code:

assign a=rd?b:a;
assign b=wr?a:b;
always@(posedge t1)
    $display("the value of a=%b",a);
The generated C code is:

```
loop_1();
printf("the value of a = %u\n", (a));
.......
int    loop_1()
       {
       if (rd) {
              loop_2();
              a = b;
              }
       }
int    loop_2()
       {
       if (wr) {
              loop_1();
              b = a;
              }
       }
```

Note that the call to "loop_1" precedes the "printf" function call generated from the "$display" Verilog code. This is an example of levelization as described above. Generation of the call to "loop_1" is driven by the requirement for a current value of "a" in the "printf" call.

In order to limit run-time loops that don't really exist, static and dynamic pruning is performed. To perform static pruning, the VCX program 50 statically determines the value of an equation, and if possible the equation is replace by a constant. For example, in the following equation:
    assign a=b && 0;
This assignment statement can be optimized to:
    assign a=0;

In order to perform the dynamic pruning, the C language comma (",") operator is used. Since all function calls to update a signal should be performed only when that signal must really be updated, these calls should be made immediately prior to the use of the identifier with the comma operator.

The following example contains a static loop that will occur dynamically because dynamic expression pruning is not performed. First is listed an excerpt of Verilog code:

assign a=en && b;
assign b=!en && a;
always@(posedge t1)
    $display ("the value of a=%b", a);

The non-dynamically pruned excerpt of generated C code follows:

```
    loop_1();
    printf("the value of a = %u\n", (a));
    .......
    int    loop_1();
           {
           loop_2();
           a = en && b;
           }
    int    loop_2();
           {
           loop_1();
           b = !en && a;
           }
```

The following generated C code contains a static loop that will not occur dynamically because dynamic expression pruning is performed.

```
    printf("the value of a = %u\n", (loop_1(), a));
    .......
    int    loop_1();
           {
           a = (en) && (loop_2(), b);
           }
    int    loop_2();
           {
           b = (!en) && (loop_1(), a);
           }
```

The methods taught herein are used to generate optimized compiled cycle-based simulator models of Integrated Circuits. The Integrated Circuit models can be translated into files that include information regarding the Integrated Circuit and placement of gates, transistors, and the like in the Integrated Circuit. These files can be to form lithographic masks which are then used to form a plurality of integrated circuits on a plurality of wafers using an integrated circuit fabrication facility. The design phase is taught in "*Principles of CMOS VLSI Design: A Systems Perspective*", by N. H. E. Weste and K. Eshragian in the VLSI Series by Addison-Wesley, 1985. Fabrication techniques are outlined in "*Silicon Processing for the VLSI Era, Volume 1: Process Technology*", by Wolf and Tauber, copyright 1986, published by Lattice Press. Process integration is taught by the second book in the series: "*Silicon Processing for the VLSI Era, Volume 2: Process Integration*", by Wolf, copyright 1990, published by Lattice Press.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

```
                                              Attachment A
/*
*********************************************************************
*
*                    Copyright (c) 1995 by Motorola Inc.
*                            All rights reserved.
*
*********************************************************************
*
*    FILE:
*        logic.h
*        "%W%; last changed %E% %U%"
*
*    DESCRIPTION:
*        Header for sched_main.c, automatically generated by genlogic.c.
*
*    CONTENTS:
*        (Static logic tables)
*/
/* Table for action_not. */
static int action_not [8] = {
    {'N', 'n', 'P', 'p', 'E', '0', '1', '—'}
};
/* Table for action_un_def. */
static int action_un_def [8] = {
    {'E', 'E', 'E', 'E', 'E', '—', '—', '—'}
};
/* Table for action_and. */
```

-continued

```
static int action_and [8][8] = {
    {'P', 'p', 'N', 'E', 'E', 'P', '0', 'p'},
    {'p', 'p', 'N', 'E', 'E', 'p', '0', 'p'},
    {'N', 'N', 'N', 'N', 'N', 'N', '0', 'N'},
    {'E', 'E', 'N', 'n', 'E', 'n', '0', 'n'},
    {'E', 'E', 'N', 'E', 'E', 'E', '0', 'E'},
    {'P', 'p', 'N', 'n', 'E', '1', '0', '—'},
    {'0', '0', '0', '0', '0', '0', '0', '0'},
    {'p', 'p', 'N', 'n', 'E', '—', '0', '—'}
};
/* Table for action_eq. */
static int action_eq [8][8] = {
    {'P', 'E', 'N', 'E', 'E', 'P', 'N', 'E'},
    {'E', 'E', 'E', 'E', 'E', 'p', 'n', 'E'},
    {'N', 'E', 'P', 'E', 'E', 'N', 'P', 'E'},
    {'E', 'E', 'E', 'E', 'E', 'n', 'p', 'E'},
    {'E', 'E', 'E', 'E', 'E', 'E', 'E', 'E'},
    {'P', 'p', 'N', 'n', 'E', '1', '0', '—'},
    {'N', 'n', 'P', 'p', 'E', '0', '1', '—'},
    {'E', 'E', 'E', 'E', 'E', '—', '—', '—'}
};
/* Table for action_neq. */
static int action_neq [8][8] = {
    {'N', 'E', 'P', 'E', 'E', 'N', 'P', 'E'},
    {'E', 'E', 'E', 'E', 'E', 'n', 'p', 'E'},
    {'P', 'E', 'N', 'E', 'E', 'P', 'N', 'E'},
    {'E', 'E', 'E', 'E', 'E', 'p', 'n', 'E'},
    {'E', 'E', 'E', 'E', 'E', 'E', 'E', 'E'},
    {'N', 'n', 'P', 'p', 'E', '0', '1', '—'},
    {'P', 'p', 'N', 'n', 'E', '1', '0', '—'},
    {'E', 'E', 'E', 'E', 'E', '—', '—', '—'}
};
/* Table for action_or. */
static int action_or [8][8] = {
    {'P', 'P', 'P', 'P', 'P', '1', 'P', 'P'},
    {'P', 'p', 'E', 'E', 'E', '1', 'p', 'p'},
    {'P', 'E', 'N', 'n', 'E', '1', 'N', 'n'},
    {'P', 'E', 'n', 'n', 'E', '1', 'n', 'n'},
    {'P', 'E', 'E', 'E', 'E', '1', 'E', 'E'},
    {'1', '1', '1', '1', '1', '1', '1', '1'},
    {'P', 'p', 'N', 'n', 'E', '1', '0', '—'},
    {'P', 'p', 'n', 'n', 'E', '1', '—', '—'}
};
/* Table for action_resolve. */
static int action_resolve [8][8] = {
    {'P', 'p', 'E', 'E', 'E', 'P', 'p', 'p'},
    {'p', 'p', 'E', 'E', 'E', 'p', 'p', 'p'},
    {'E', 'E', 'N', 'n', 'E', 'n', 'N', 'n'},
    {'E', 'E', 'n', 'n', 'E', 'n', 'n', 'n'},
    {'E', 'E', 'E', 'E', 'E', 'E', 'E', 'E'},
    {'P', 'p', 'n', 'n', 'E', '1', '—', '—'},
    {'p', 'p', 'N', 'n', 'E', '—', '0', '—'},
    {'p', 'p', 'n', 'n', 'E', '—', '—', '—'}
};
/* Table for action_bin_def. */
static int action_bin_def [8][8] = {
    {'E', 'E', 'E', 'E', 'E', 'E', 'E', 'E'},
    {'E', 'E', 'E', 'E', 'E', 'E', 'E', 'E'},
    {'E', 'E', 'E', 'E', 'E', 'E', 'E', 'E'},
    {'E', 'E', 'E', 'E', 'E', 'E', 'E', 'E'},
    {'E', 'E', 'E', 'E', 'E', 'E', 'E', 'E'},
    {'E', 'E', 'E', 'E', 'E', '—', '—', '—'},
    {'E', 'E', 'E', 'E', 'E', '—', '—', '—'},
    {'E', 'E', 'E', 'E', 'E', '—', '—', '—'}
};
```

We claim:

1. A method of processing computer executable code based on a model of an Integrated Circuit said method comprising the steps of:

A) testing within a first function of the computer executable code whether a first signal of the model is in one of a first state and a second state;

B) conditionally executing a second function of the computer executable code and executing a third function of the computer executable code when the first signal is determined to be in the first state in step (A), C) testing within the third function whether a second signal of the model is in one of a first state and a second state; and D) conditionally executing the first function from within the third function when the second signal is determined to be in the second state in step (C).

2. The method in claim 1 wherein:

the first signal and the second signal are mutually exclusive.

3. The method in claim 1 wherein:

the third function is the second function.

4. The method in claim 1 wherein:

the third function is not the second function, and the third function is conditionally executed based on results of testing a third signal of the model.

5. The method in claim 1 which further comprises:

E) executing the first function prior to testing whether the first signal is in the first signal first state in step (A).

6. The method in claim 1 which further comprises

E) indicating an error condition whenever both the first signal is in the first state and the second signal is in the first state.

7. The method in claim 1 which further comprises:

E) suppressing recursive execution of the first function whenever both the first signal is in the first state and the second signal is in the first state.

8. The method in claim 1 wherein:

the first state of the first signal represents signal assertion of the first signal and the first state of the second signal represents signal assertion of the second signal.

9. The method in claim 1 wherein:

the first function is executed in step (D) if the second signal is asserted.

10. A compiled cycle based simulator utilizing the method in claim 1 to optimize execution.

11. A method of optimizing execution of code by a compiled cycle based simulator generated from a model of an Integrated Circuit, wherein:

the model of the Integrated Circuit has:
  a first control signal having a first control signal first state and a first control signal second state,
  a second control signal having a second control signal first state and a second control signal second state,
  a first I/O signal and a second I/O signal, whenever the first control signal is in the first control signal first state, the first I/O signal is dependent upon the second I/O signal, and whenever the second control signal is in the second control signal first state, the second I/O signal is dependent upon the first I/O signal, said method comprising the steps of:

a) conditionally executing a second function from within a first function and conditionally assigning the second I/O signal to the first I/O signal from within the first function, wherein said step comprises:
  1) testing within the first function whether the first control signal is in the first control signal first state or first control signal second state; and
  2) invoking execution of the second function whenever the first control signal is in the first control signal second state; and b) conditionally executing the first function from within a third function and conditionally assigning the first I/O signal to the second I/O signal from within the third function, wherein:

execution of the third function is dependent upon execution of the second function, said step comprising:
  1) testing within the third function whether the second control signal is in the second control signal first state or second control signal second state; and
  2) suppressing execution of the first function whenever the second control signal is in the second control signal second state.

12. The method in claim 11 wherein:

the first control signal is the second control signal, the first control signal first state is the second control signal second state, and the first control signal second state is the second control signal first state.

13. The method in claim 11 wherein step (a) further comprises:
  3) suppressing assignment of the second I/O signal to the first I/O signal whenever the first control signal is in the first control signal second state; and step (b) further comprises:
  3) suppressing assignment of the first I/O signal to the second I/O signal whenever the second control signal is in the second control signal second state.

14. The method in claim 11 wherein:

step (a) further comprises:
  3) assigning the second I/O signal to the first I/O signal after the second function is executed within the first function; and step (b) further comprises:
  3) assigning the first I/O signal to the second I/O signal after the first function is executed within the third function.

15. The method in claim 11 wherein:

the second function is the third function.

16. The method in claim 11 wherein:

the first I/O signal and the second I/O signal combined model a two way bus.

17. The compiled cycle based simulator utilizing the method in claim 11 to optimize execution.

18. A computer readable medium containing the compiled cycle based simulator in claim 17 encoded in a machine readable format.

19. A method of manufacturing the computer readable medium in claim 18 which comprises:

encoding the compiled cycle based simulator in machine readable format on the computer readable medium.

* * * * *